US011862761B2

(12) United States Patent
Peng et al.

(10) Patent No.: US 11,862,761 B2
(45) Date of Patent: Jan. 2, 2024

(54) LIGHT-EMITTING MODULE AND DISPLAY APPARATUS

(71) Applicant: BOE Technology Group Co., Ltd., Beijing (CN)

(72) Inventors: Weiting Peng, Beijing (CN); Xianqin Meng, Beijing (CN); Qiuyu Ling, Beijing (CN); Yishan Tian, Beijing (CN); Yujiao Guo, Beijing (CN); Wei Wang, Beijing (CN); Xiaochuan Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 286 days.

(21) Appl. No.: 17/471,185

(22) Filed: Sep. 10, 2021

(65) Prior Publication Data
US 2022/0238770 A1 Jul. 28, 2022

(30) Foreign Application Priority Data

Jan. 27, 2021 (CN) .......................... 202110112061.7

(51) Int. Cl.
*H01L 33/60* (2010.01)
*H01L 33/62* (2010.01)
*H01L 33/58* (2010.01)
*H01L 25/075* (2006.01)

(52) U.S. Cl.
CPC .......... *H01L 33/60* (2013.01); *H01L 25/0753* (2013.01); *H01L 33/58* (2013.01); *H01L 33/62* (2013.01)

(58) Field of Classification Search
CPC ......... H01L 33/60; H01L 33/58; H01L 33/62; H01L 25/0753
See application file for complete search history.

(56) References Cited

U.S. PATENT DOCUMENTS

2004/0233354 A1* 11/2004 Uehara ............. G02F 1/133526
349/95
2005/0104073 A1* 5/2005 Chou ................ G02F 1/133603
313/500

FOREIGN PATENT DOCUMENTS

CN 104006327 A * 8/2014 ....... G02F 1/133603
CN 110176448 A * 8/2019 ................ F21V 9/40

* cited by examiner

Primary Examiner — Mary Ellen Bowman
(74) Attorney, Agent, or Firm — Ling Wu; Stephen Wang; Ling and Yang Intellectual Property

(57) ABSTRACT

Provided are a light-emitting module and a display apparatus. The light-emitting module may include a substrate, at least one light-emitting element located on a side of the substrate, and a first light-uniformizing component and a reflective layer disposed on a light-exit side of the light-emitting element; wherein, the first light-uniformizing component is configured to make light emitted by the light-emitting element be uniformly incident on the reflective layer; and the reflective layer is configured to reflect the light incident on the reflective layer toward a direction away from the light-exit side of the light-emitting element.

20 Claims, 12 Drawing Sheets

LIGHT-EMITTING MODULE AND DISPLAY APPARATUS

CROSS-REFERENCE TO RELATED APPLICATION

The present application claims the priority to Chinese Patent Application No. 202110112061.7 filed to the CNIPA on Jan. 27, 2021, the content of which is incorporated herein by reference.

TECHNICAL FIELD

Embodiments of the present disclosure relate to, but are not limited to, the field of display technologies, in particular to a light-emitting module and a display apparatus.

BACKGROUND

Nowadays, a light source of a backlight module is mainly achieved by a light-exit diode (LED). In a straight down type backlight module, more film layer structures and a larger optical distance (OD) are often required for uniformizing light, resulting in larger thickness and higher cost of the straight down type backlight module.

SUMMARY

The following is a summary of the subject matter detailed herein. This summary is not intended to limit the scope of protection of claims.

Embodiments of the present disclosure mainly provide following technical solutions.

In a first aspect, an embodiment of the present disclosure provides a light-emitting module, including a substrate, at least one light-emitting element located on a side of the substrate, and a first light-uniformizing component and a reflective layer disposed on a light-exit side of the light-emitting element; wherein, the first light-uniformizing component is configured to make light emitted by the light-emitting element be uniformly incident on the reflective layer; and the reflective layer is configured to reflect the light incident on the reflective layer toward a direction away from the light-exit side of the light-emitting element.

In a second aspect, an embodiment of the present disclosure provides a display module, which includes a display panel and any of the above light-emitting module, wherein the display panel is disposed on a side away from the light-exit side of the light-emitting element.

Other features and advantages of the present disclosure will be described in the following description, and will be partially apparent from the description, or understood by implementing the present disclosure. Other advantages of the present disclosure may be achieved and obtained by the solutions described in the specification and drawings.

After reading and understanding the drawings and the detailed description, other aspects may be understood.

BRIEF DESCRIPTION OF DRAWINGS

The drawings provide an understanding of the technical solutions of the present disclosure, form a part of the specification, and are used to explain, together with the embodiments of the present disclosure, the technical solutions of the present disclosure and not intended to form limits to the technical solutions of the present disclosure. A shape and a size of each component in the drawings do not reflect true proportions and only to be used to schematically illustrate contents of the present disclosure.

DETAILED DESCRIPTION

Figure 1A:
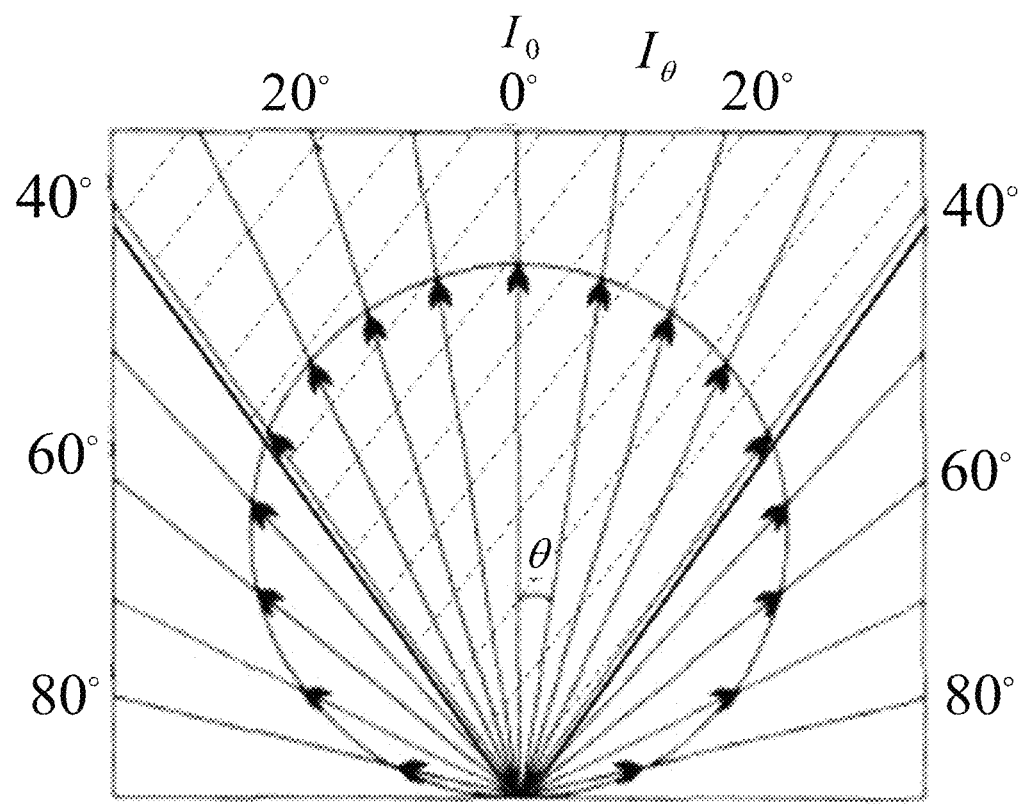
FIG. 1A is a schematic diagram of light emission of a Lambertian light source.

Multiple embodiments are described in the present disclosure, but the description is exemplary rather than restrictive, and there may be more embodiments and implementation solutions within the scope of the embodiments described in the present disclosure. Although many possible feature combinations are shown in the drawings and discussed in specific implementation modes, the disclosed features may also be combined in many other manners. Unless specifically restricted, any feature or element of any embodiment may be combined with any other feature or element in any other embodiment for use, or may take place of any other feature or element in any other embodiment.

When a representative embodiment is described, a method and/or process may have been presented as a specific sequence of steps in the specification. However, to an extent that the method or the process does not depend on the specific sequence of the steps described herein, the method or the process should not be limited to the steps in the specific sequence described. As understood by those of ordinary skills in the art, another sequence of steps is also possible. Therefore, the specific sequence of steps described in the specification should not be explained as a limit to the claims. In addition, claims with respect to the method and/or process should not be limited to execute their steps according to a written sequence. A person skilled in the art may easily understand that these sequences may change, and are still maintained in the spirit and scope of the embodiments of the present disclosure.

Unless otherwise defined, technical terms or scientific terms used in the embodiments of the present disclosure shall have common meanings as construed by those of ordinary skills in the art to which the present disclosure pertains. "First", "second", and similar terms used in the embodiments of the present disclosure do not represent any sequence, quantity, or significance but are only adopted to distinguish different components. "Include", "contain", or a similar word means that an element or object appearing before the word covers an element or object and equivalent thereof listed after the word and does not exclude other elements or objects. "Connect", "interconnect", or a similar word is not limited to physical or mechanical connection but may include electrical connection, either direct or indirect.

In the embodiments of the present disclosure, "about" means that a limit is not strictly limited, and a value within a range of process and measurement error is allowed.

A conventional backlight module often includes the following parts: a substrate and a related drive circuit, an LED light source, an LED encapsulation layer, a quantum dots (QD) film, a first diffusion sheet, a prism sheet with two-layer orthogonal structures, and a second diffusion sheet. Among them, on one hand, a multi-layer diffusion sheet is often needed to uniformize light in order to achieve uniformity of exited light, so that an overall thickness of a backlight module is relatively increased and an overall efficiency of light exiting is greatly affected adversely. On the other hand, a conventional LED chip is based on upward light emission, and a coverage area of a single lamp is limited, more chips are needed to ensure a light coverage of a light-exit surface, which leads to a significant increase in a backlight cost of a large-size display device, and affects adversely an overall control for a volume and a cost.

A Mini-LED light source has smaller chip size and broad application prospects, it is used in a backlight module, because of high operability of each chip and high fineness of a coverage area, operations such as regional lighting may be achieved and controllability of the backlight module may be improved. However, in a straight down type backlight module, a larger quantity of light sources are usually needed, more film layer structures and a larger optical distance are needed to achieve a uniform light effect with a high light uniformity, which will cause a Mini-LED straight down type backlight module to be relatively thicker. This limits a Mini-LED light source as a backlight module application to be thinner and lighter in design, and will bring about a problem of a higher cost.

FIG. 1A is a schematic diagram of light emission of a Lambertian light source. As shown in FIG. 1A, an LED light source (e.g., a Mini-LED light source) is usually a Lambertian light source (solid line in FIG. 1), and its energy distribution is shown in Formula (1).

$$I_\theta = I_0 \cos\theta \qquad \text{Formula (1)}$$

As shown in FIG. 1, since the LED light source is encapsulated in a light-emitting module, for this light-exit characteristic of the LED light source, only energy within a radiation angle range of +/−40 degrees can be utilized and light beams beyond +/−40 degrees are limited in an LED structure due to total reflection. In addition, an outgoing light within the radiation angle range of +/−40 degrees concentrates about 61% of light energy of the LED light source.

Figure 1B:
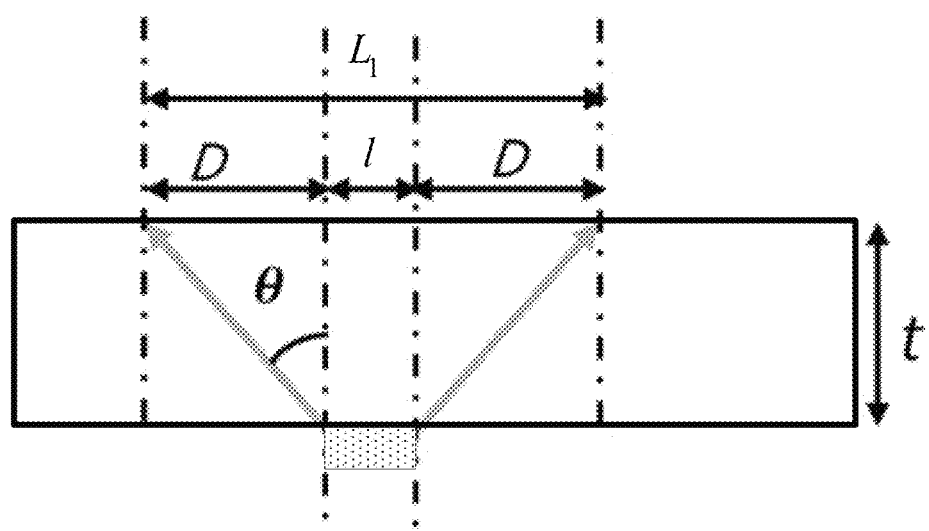
FIG. 1B is a schematic diagram of coverage of light emitted upwards by a Mini-LED light source.

FIG. 1B is a schematic diagram of coverage of light emitted upwards by a Mini-LED light source. As shown in FIG. 1B, in a light-exit range of a Mini-LED, after passing through an optical medium with a thickness of t, a width (or diameter) $L_1$ of an area that can be radiated by the Mini-LED light source may be shown in the following Formula (2).

$$L_1 = 2 \times D + l = 2 \times t \times \tan\theta + l \qquad \text{Formula (2)}$$

In Formula (2), θ indicates a total reflection angle of the optical medium to Mini-LED light, l indicates a chip length of the Mini-LED light source, D indicates a coverage range of Mini-LED edge light within a range of the total reflection angle, and $L_1$ indicates a coverage diameter of light emitted on a surface of the optical medium when a Mini-LED chip emits light upwards (i.e. the width of the area that can be radiated by the Mini-LED light source).

Taking an optical medium as glass with a thickness of 0.5 mm and a refractive index of 1.52, and a chip length of a Mini-LED light source is 100 μm as an example, in an available range of a Mini-LED radiation light, when a light emitted by a Mini-LED is transmitted through the glass and coupled out of the glass to the air, L1=0.969 mm (i.e., a spot coverage of about 1 mm in diameter) may be calculated through the above Formula (2). In order to achieve backlight uniformity, a Mini-LED chip arrangement design is needed to be carried out for a conventional backlight module based on this. For a large-size display apparatus, such as a 65-inch display (wherein a size of an AA area is 1430 mm×840 mm), at least 1.28 million Mini-LED chips are needed to achieve uniformity of exited light and brightness, which causes a problem of a higher cost. In addition, in order to improve the uniformity of exited light, a diffusion sheet with a certain thickness is also used for the conventional backlight module. For example, a diffusion sheet with a thickness of 2 mm is used for a Mini-LED backlight module used in some 65-inch 4K displays to achieve uniformity of backlight, which makes a thickness of the backlight module reach about 3.85 mm. It may be seen that the use of this thick diffusion sheet greatly affects adversely thinning of a display device, and this thick diffusion sheet cannot be applied to thin and light display devices.

An embodiment of the present disclosure provides a light-emitting module capable of achieving higher light uniformity, a higher light effect, a smaller optical distance (OD), a lower thickness, and a lower quantity of light-emitting elements, which may be widely applied to a backlight module in a design of a display device with a large size and a lower requirement for thickness.

In an exemplary embodiment, the light-emitting module may include a substrate, at least one light-emitting element located at one side of the substrate, and a first light-uniformizing component and a reflective layer disposed at a light-exit side of the light-emitting element; wherein, the first light-uniformizing component is configured to make light emitted by the light-emitting element uniformly incident on the reflective layer; and the reflective layer is configured to reflect the light incident on the reflective layer toward a direction away from the light-exit side of the light-emitting element. In this way, the light-emitting element emits light downwards and the light is reflected by the reflection layer disposed at one side of the first light-uniformizing component, so that a thickness of the substrate may be effectively utilized to achieve a light-uniformizing optical path, a structure of a diffusion sheet in the light-emitting module may be omitted, a thickness as well as a cost of the light-emitting module can be reduced. By using a first light-uniformizing component to disperse light and using a reflective layer of the first light-uniformizing component to undermine a total reflection waveguide effect, a light-exiting effect with high uniformity can be achieved, an effect of increasing a light-taking amount can be achieved, and a light-taking efficiency of a light-emitting module may be improved.

In an exemplary embodiment, the light-emitting module may further include an encapsulation layer, wherein the encapsulation layer and the substrate are respectively located at two sides of the light-emitting element. In this way, by using a thickness of the substrate and a light source encapsulation structure as a light-uniformizing optical path, a structure of a diffusion sheet in the light-emitting module may be omitted, a thickness of the light-emitting module can be reduced more effectively and a cost can be reduced. By using a first light-uniformizing component to disperse light and using a reflective layer of the first light-uniformizing component to undermine a total reflection waveguide effect, a light-exiting effect with high uniformity can be achieved, an effect of increasing a light-taking amount can be achieved, and a light-taking efficiency of a light-emitting module may be improved.

For example, when an encapsulation layer is located on a light-exit side of a light-emitting element and a substrate is located on a side away from the light-exit side of the light-emitting element, a reflective layer is configured to reflect light incident on the reflective layer toward a direction away from the light-exit side (i.e., toward a direction close to the substrate) and exit from the substrate. Or, when a substrate is located on a light-exit side of a light-emitting element and an encapsulation layer is located on a side away from the light-exit side of the light-emitting element, a reflective layer is configured to reflect light incident on the reflective layer toward a direction away from the light-exit side (i.e., toward a direction close to the encapsulation layer) and exit from the encapsulation layer.

In an exemplary embodiment, the light-emitting module may further include a second light-uniformizing component disposed on a side away from a light-exit side of a light-emitting element, configured to uniformize light emitted from a substrate when the substrate is located on a side away from the light-exit side of the light-emitting element, or configured to uniformize light emitted from a encapsulation layer when the encapsulation layer is located on a side away from the light-exit side of the light-emitting element.

In an exemplary embodiment, the light-emitting module may further include a transflective film disposed on a side of the second light-uniformizing component away from the light-emitting element.

In an exemplary embodiment, the light-emitting module may further include a metal wiring layer disposed between the substrate and the light-emitting element, wherein the metal wiring layer includes multiple transflective control areas, and each transflective control area includes multiple concentrically disposed areas with different transmittances.

Next, a light-emitting module will be described below by taking an example where an encapsulation layer is located on a light-exit side of a light-emitting element and a substrate is located on a non-light-exit side of the light-emitting element (i.e., the substrate is located on a side away from the light-exit side of the light-emitting element).

Figure 2:
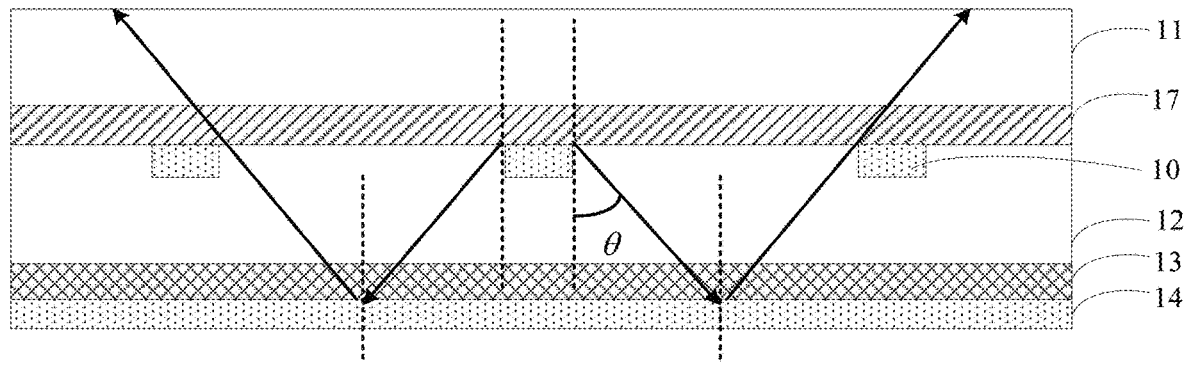
FIG. 2 is a schematic diagram of a first structure of a light-emitting module according to an embodiment of the present disclosure.

FIG. 2 is a schematic diagram of a first structure of a light-emitting module according to an embodiment of the present disclosure. As shown in FIG. 2, the light-emitting module may include a light-emitting element 10, a substrate 11, an encapsulation layer 12, a first light-uniformizing component 13, and a reflective layer 14 disposed on a side of the first light-uniformizing component 13 away from the light-emitting element 10.

The encapsulation layer 12 is located on a light-exit side of the light-emitting element 10. The substrate 11 is located on a non-light-exit side of the light-emitting element 10, and a side of the substrate 11 away from the light-emitting element 10 is a light-exit surface of the light-emitting module.

The first light-uniformizing component 13 is located on the light-exit side of the light-emitting element 10 (that is, on a side of the encapsulation layer 12 away from the light-emitting element 10), and is configured to transmit light emitted by the light-emitting element 10, so that the light emitted by the light-emitting element 10 is uniformly incident on the reflective layer 14; and the first light-uniformizing component 13 is further configured to transmit light reflected by the reflective layer 14, so that the reflected light is uniformly incident on the encapsulation layer 12.

The reflective layer 14 is configured to reflect light incident on the reflective layer 14 in a direction close to the substrate 11 (i.e., toward a direction away from the light-exit side of the light-emitting element) when the substrate 11 is located on the non-light-exit side of the light-emitting element 10, and the light is uniformly emitted from the side of the substrate 11 away from the light-emitting element 10.

In this way, when the substrate is located on the non-light-exit side of the light-emitting element and the encapsulation layer is located on the light-exit side of the light-emitting element, the light-emitting element emits light downwards in a form of a Lambertian light source (that is, emits light toward a direction close to the encapsulation layer). Light emitted by the light-emitting element enters the encapsulation layer, and then enters the first light-uniformizing component after being transmitted through the encapsulation layer. The first light-uniformizing component transmits and uniformizes the light emitted by the light-emitting element. After the light is uniformized by the first light-uniformizing component, it is reflected by the reflective layer provided on a lower surface (i.e., a side of the first light-uniformizing component away from the light-emitting element) of the first light-uniformizing component. The light reflected by the reflective layer enters the encapsulation layer after being transmitted by the first light-uniformizing component, and then enters the substrate after being transmitted by the encapsulation layer. After being transmitted by the substrate, the light exits from a light-exit surface of the substrate. In this way, thicknesses of the encapsulation layer and the substrate may be effectively used to increase an optical path by using the light-emitting element to emit light downwards. Therefore, compared with a conventional backlight module, a structure of a diffusion sheet in a light-emitting module may be omitted, a thickness as well as a cost of the light-emitting module can be reduced, and an overall light-exit efficiency is improved. Furthermore, the light emitted by the light-emitting element is scattered by the first light-uniformizing component, so that the light emitted by the light-emitting element may be uniformized, which can improve uniformity of light emitted from the light-exit surface, increase utilization of light energy of the light-emitting element, and enhance luminous efficiency.

In an exemplary embodiment, the light-emitting element may be a Mini-LED light source, an LED light source, and the like.

Figure 3:
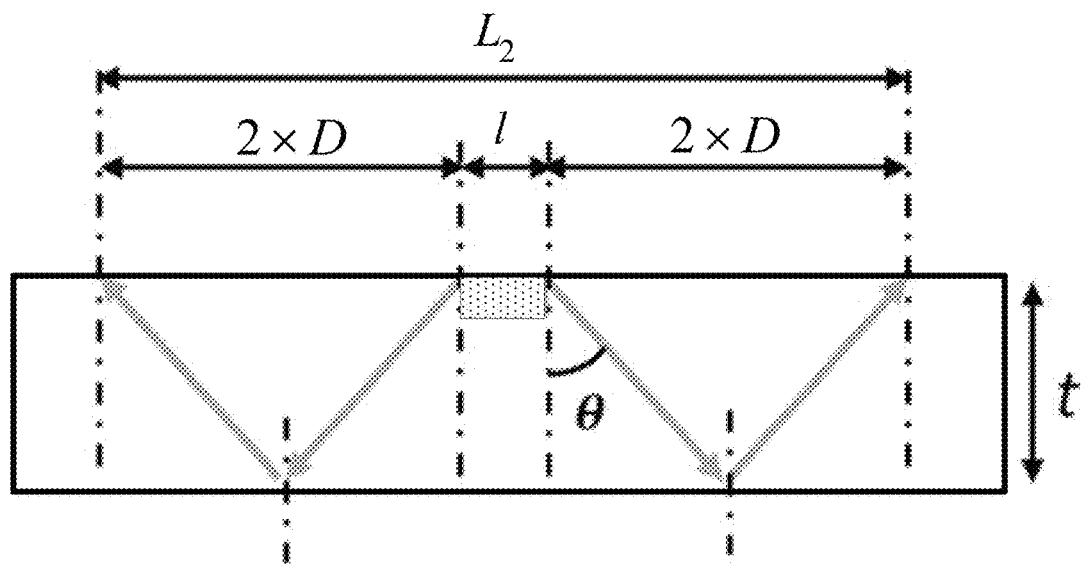
FIG. 3 is a schematic diagram of coverage of light emitted downwards by a Mini-LED light source.

FIG. 3 is a schematic diagram of coverage of light emitted downwards by a Mini-LED light source. As shown in FIG. 3, in a light-exit range of a Mini-LED, after passing through an optical medium with a thickness of t, a width (or diameter) $L_2$ of an area that can be radiated by the Mini-LED light source may be shown in the following Formula (3).

$$L_2 = 4 \times D + l = 4 \times t \times \tan\theta + l \qquad \text{Formula (3)}$$

In Formula (3), θ indicates a total reflection angle of the optical medium to Mini-LED light, l indicates a chip length of the Mini-LED light source, D indicates a coverage range of Mini-LED edge light within the total reflection angle range, and $L_2$ indicates a coverage diameter of light emitted on a surface of the optical medium when a Mini-LED chip emits light downwards (i.e. the width of the area that can be radiated by the Mini-LED light source).

According to Formula (3), in the light-emitting module provided in the embodiment of the present disclosure, by using a design solution of inverted light emission of a Mini-LED chip, since light emitted by the Mini-LED is returned in a substrate or an encapsulation layer, an optical path may be expanded, and a coverage area of each LED chip on an upper surface has been expanded to a certain extent. Because of expansion of a coverage area of a single Mini-LED bright spot, a quantity of Mini-LED chips in a whole light-emitting module may be directly decreased, thus reducing a cost of the light-emitting module.

As may be seen from the above, in the light-emitting module in the embodiment of the present disclosure, a substrate and a light source encapsulation structure are used as a light-uniformizing optical path, a structure of a diffusion sheet in a light-emitting module may be omitted, and a thickness as well as a cost of the light-emitting module can be reduced. By using a first light-uniformizing component to disperse light and using a reflective layer of the first light-uniformizing component to undermine a total reflection waveguide effect, a light-exiting effect with high uniformity can be achieved, an effect of increasing a light-taking amount can be achieved, and a light-taking efficiency of a light-emitting module may be improved. By using a solution that a light-emitting element emits light downwards, an optical path may be enlarged, and a coverage area of emitted light of each light-emitting element is enlarged to a certain extent, so that a quantity of chips of light-emitting elements in an entire light-emitting module may be decreased, thereby reducing a cost of the light-emitting module.

Figure 4:
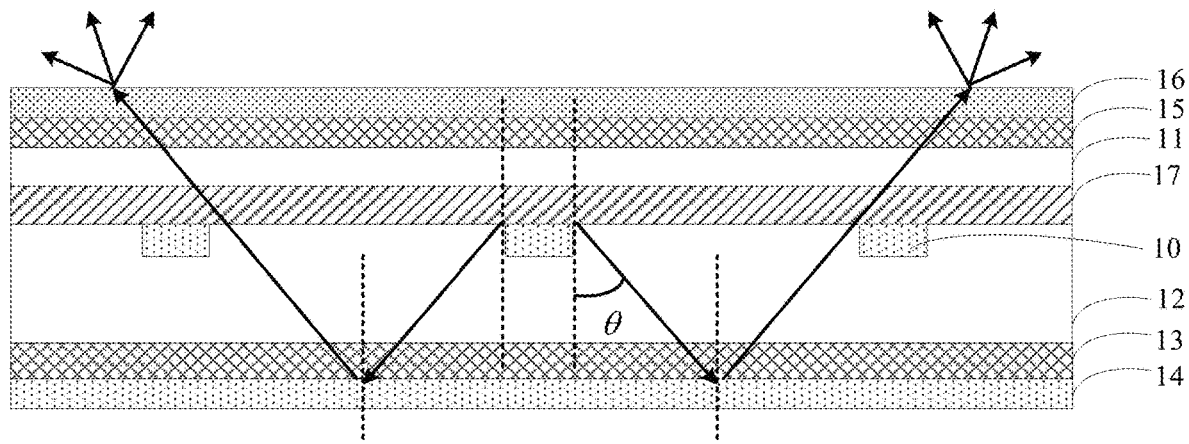
FIG. 4 is a schematic diagram of a second structure of a light-emitting module according to an embodiment of the present disclosure.

In an exemplary embodiment, as shown in FIG. 4, the light-emitting module may further include a second light-uniformizing component 15; the second light-uniformizing component 15 is disposed on a side of a substrate 11 away from a light-emitting element 10 (that is, on a non-light-exit side of the light-emitting element 10), and is configured to uniformize light emitted from the substrate 11 when the substrate 11 is located on the non-light-exit side of the light-emitting element 10. In this way, when the substrate is located on the non-light-exit side of the light-emitting element, light emitted from the substrate is scattered by the second light-uniformizing component disposed on an upper surface of the substrate (i.e., a side of the substrate away from the light-emitting element), so that a reflection/diffraction angle may be increased, and most of the emitted light may be transmitted repeatedly in oscillation in the substrate. Therefore, a quantity of light-emitting elements used is further reduced, light-uniformizing exiting in a larger area is achieved, and a light-uniformizing effect and a light efficiency are further improved, therefore, power consumption of the light-emitting module is reduced accordingly.

In an exemplary embodiment, as still shown in FIG. 4, the light-emitting module may further include a transflective film 16 disposed on a side of the second light equalizing module 15 away from the light-emitting element 10 (at this time, that is, on a side of the substrate 11 away from the light-emitting element 10). In this way, since the substrate is located on a non-light-exit side of the light-emitting element, light emitted from the substrate is scattered by the second light-uniformizing component and the transflective film disposed on an upper surface of the substrate (i.e., a side of the substrate away from the light-emitting element) together, so that a reflection/diffraction angle can be better increased, and most of the emitted light may be transmitted repeatedly in oscillation in the substrate. Therefore, a quantity of light-emitting elements used is reduced, light-uniformizing exiting in a larger area is better achieved, and a light-uniformizing effect and a light efficiency are greatly improved, therefore, power consumption of the light-emitting module is reduced accordingly.

Next, a light-emitting module will be described below by taking an example where a substrate is located on a light-exit side of a light-emitting element and an encapsulation layer is located on a non-light-exit side of the light-emitting element (i.e., the encapsulation layer is located on a side away from the light-exit side of the light-emitting element).

Figure 5:
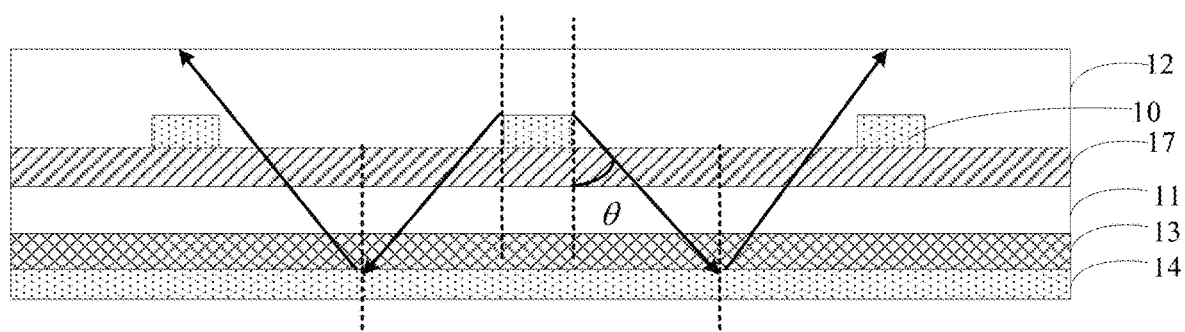
FIG. 5 is a schematic diagram of a third structure of a light-emitting module according to an embodiment of the present disclosure.

FIG. 5 is a schematic diagram of a third structure of a light-emitting module according to an embodiment of the present disclosure. As shown in FIG. 5, the light-emitting module may include a light-emitting element 10, a substrate 11, an encapsulation layer 12, a first light-uniformizing component 13, and a reflective layer 14 disposed on a side of the first light-uniformizing component 13 away from the light-emitting element 10.

The substrate 11 is located on a light-exit side of the light-emitting element 10.

The encapsulation layer 12 is located on a non-light-exit side of the light-emitting element 10, and a side of the encapsulation layer 12 away from the light-emitting element 10 is a light-exit surface of the light-emitting module.

The first light-uniformizing component 13 is located on the light-exit side of the light-emitting element 10 (that is, on a side of the substrate 11 away from the light-emitting element 10), and is configured to transmit light emitted by the light-emitting element 10, so that the light emitted by the light-emitting element 10 is uniformly incident on the reflective layer 14; and the first light-uniformizing component 13 is also configured to transmit light reflected by the reflective layer 14, so that the reflected light is uniformly incident on the substrate 11.

The reflective layer 14 is configured to reflect light incident on the reflective layer 14 in a direction close to the encapsulation layer 12 (i.e., toward a direction away from the light-exit side of the light-emitting element) when the substrate 11 is located on the light-exit side of the light-emitting element 10, and the light is uniformly emitted from the encapsulation layer 12.

In this way, when the substrate is located on the light-exit side of the light-emitting element and the encapsulation layer is located on the non-light-exit side of the light-emitting element, the light-emitting element emits light downwards in a form of a Lambertian light source. Light emitted by the light-emitting element enters the substrate, and then enters the first light-uniformizing component after being transmitted through the substrate. The first light-uniformizing component transmits and uniformizes the light emitted by the light-emitting element. After the light is uniformized by the first light-uniformizing component, it is reflected by the reflective layer provided on a lower surface of the first light-uniformizing component. The light reflected by the reflective layer enters the substrate after being transmitted by the first light-uniformizing component, and then enters the encapsulation layer after being transmitted by the substrate. After being transmitted by the encapsulation layer, the light exits from a light-exit surface of the encapsulation layer. In this way, thicknesses of the encapsulation layer and the substrate may be effectively used to increase an optical path by using the light-emitting element to emit light downwards. Therefore, compared with a conventional backlight module, a structure of a diffusion sheet in the light-emitting module may be omitted, a thickness as well as a cost of the light-emitting module can be reduced, and an overall light-exit efficiency can be improved. Furthermore, the light emitted by the light-emitting element is scattered by the first light-uniformizing component, so that the light emitted by the light-emitting element may be uniformized, which can improve uniformity of light emitted from a light-exit surface, increase utilization of light energy of the light-emitting element, and enhance a luminous efficiency.

As may be seen from the above, in the light-emitting module in the embodiment of the present disclosure, a substrate and a light source encapsulation structure are used as a light-uniformizing optical path; a structure of a diffusion sheet may be omitted, and a thickness as well as a cost of the light-emitting module can be reduced. By using a first light-uniformizing component to disperse light in combination with a reflective layer of the first light-uniformizing component to change a total reflection waveguide effect, a light-exiting effect with high uniformity can be achieved, an effect of increasing a light-taking amount can be achieved, and a light-taking efficiency of a light-emitting module may be improved, and a backlight efficiency is increased. By using a solution that a light-emitting element emits light downwards, an optical path may be enlarged, and a coverage area of emitted light of each light-emitting element is enlarged to a certain extent, so that a quantity of chips of light-emitting elements are used in an entire light-emitting module may be decreased, thereby reducing ae cost of the light-emitting module.

Figure 6:
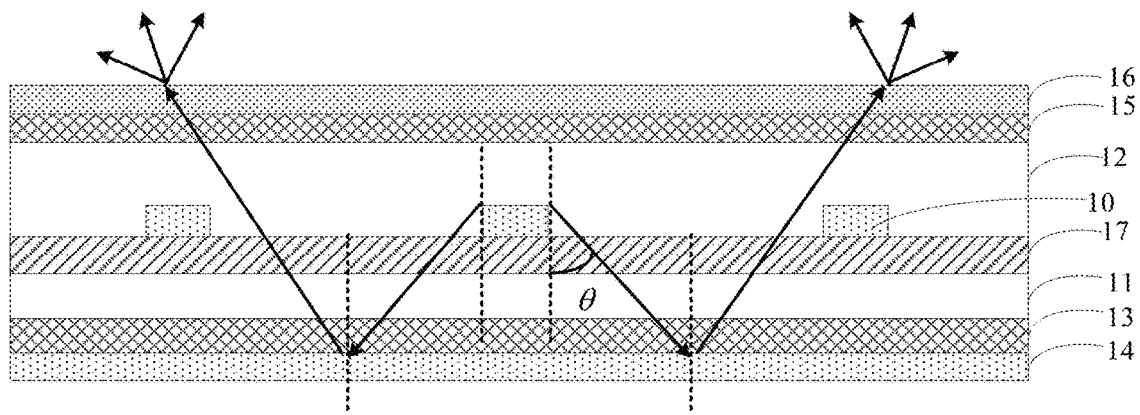
FIG. 6 is a schematic diagram of a fourth structure of a light-emitting module according to an embodiment of the present disclosure.

In an exemplary embodiment, as shown in FIG. 6, the light-emitting module may further include a second light-uniformizing component 15; the second light-uniformizing component 15 is disposed on a side of the encapsulation layer 12 away from the light-emitting element 10 (i.e., on a non-light-exit side of the light-emitting element 10), and is configured to uniformize light emitted from the encapsulation layer 12 when the substrate 11 is located on the non-light-exit side of the light-emitting element 10 (i.e., the encapsulation layer 12 is on the non-light-exit side of the light-emitting element 10). In this way, when the encapsulation layer is located on the non-light-exit side of the light-emitting element, the light emitted from the encapsulation layer may be scattered by the second light-uniformizing component disposed on an upper surface of the encapsulation layer (i.e., a side of the encapsulation layer away from the light-emitting element), so that a reflection/diffraction angle may be increased, and most of the emitted light may be transmitted repeatedly in oscillation in the encapsulation layer. Therefore, a quantity of light-emitting elements used may be further reduced, light-uniformizing exiting in a larger area may be achieved, and a light-uniformizing effect and a light efficiency are further improved, thus power consumption of the light-emitting module will be reduced accordingly.

In an exemplary embodiment, as still shown in FIG. 6, the light-emitting module may further include a transflective film 16 disposed on a side of the second light equalizing module 15 away from the light-emitting element 10 (at this time, that is, on a side of the encapsulation layer 12 away from the light-emitting element 10). In this way, since the encapsulation layer is located on the non-light-exit side of the light-emitting element, light emitted from the encapsulation layer is scattered by the second light-uniformizing component and the transflective film disposed on an upper surface of the substrate (i.e., a side of the encapsulation layer away from the light-emitting element) together, so that a reflection/diffraction angle may be better increased, and most of the emitted light may be transmitted repeatedly in oscillation in the substrate. Therefore, a quantity of light-emitting elements used may be reduced, light-uniformizing exiting in a larger area is better achieved, and a light-uniformizing effect and a light efficiency are greatly improved, thus power consumption of the light-emitting module will be reduced accordingly.

In an exemplary embodiment, as shown in FIG. 2, FIG. 4, FIG. 5, and FIG. 6, the light-emitting module may further include a metal wiring layer 17 disposed on a side of the light-emitting element 10 away from the encapsulation layer 12. The metal wiring layer includes multiple transflective control areas (not shown in FIG. 2, FIG. 4, FIG. 5, or FIG. 6), and each transflective control area includes multiple concentrically disposed areas with different transmittances. Here, "concentric" may mean that multiple areas have a same geometric center.

In this way, the metal wiring layer is located between the substrate and the encapsulation layer. Through a transflective control area design of the metal wiring layer, a transflective distribution design of a light-exit surface of the substrate or the encapsulation layer is achieved, and a light energy intensively emitted by light-emitting elements is redistributed to reduce transmitted light and increase reflected light entering a next transmission process, thus achieving an energy distribution and a light-uniformizing design of the emitted light. In this way, a light-uniformizing exiting effect may be achieved on one hand, on the other hand, a quantity of light-emitting elements can be greatly reduced, and a cost can be reduced.

In an exemplary embodiment, each light-emitting element may correspond to one transflective control area.

In an exemplary embodiment, taking an example where each light-emitting element corresponds to one transflective control area, a geometric center of each light-emitting element may be configured corresponding to a geometric center of its corresponding transflective control area.

In a practical application, a quantity of divided areas included in each transflective control area depends on a distance of chips of light-emitting elements and a designed surface transmittance. For example, a transflective control area may include three areas. Of course, a quantity of divided areas may also be other. For example, under a condition of a large distance between chips of light-emitting elements or under a condition of a low requirement for an overall transmittance, more divided areas may be designed, such as 4 and 5. Here, the embodiments of the present disclosure are not limited here.

The following description takes a transflective control area including three areas as an example.

Figure 7:
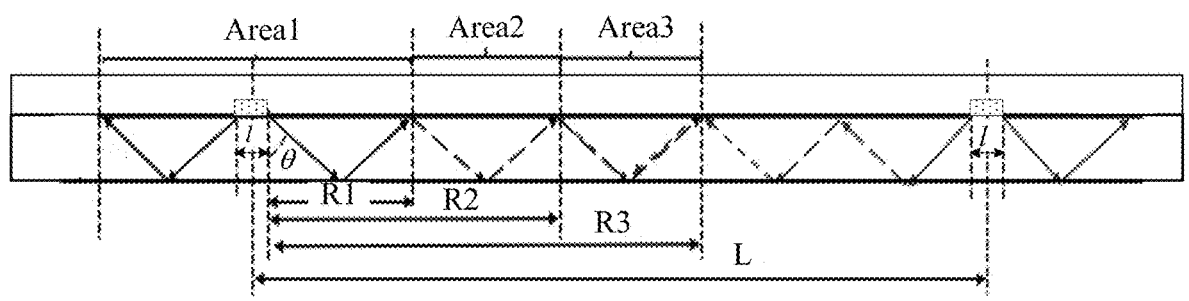
FIG. 7 is a schematic diagram of a distribution design of a transflective control area according to an embodiment of the present disclosure.

Taking a 3-area energy distribution design where a substrate is located on a non-light-exit side of a light-emitting element, an encapsulation layer is located on a light-exit side of the light-emitting element, and a LED light source emits light downwards into the encapsulation layer as an example, as shown in FIG. 7, a geometric center of the LED light source corresponds to a geometric center of Area1, light emitted by the LED light source propagates in the encapsulation layer, a main light-exit area is Area1, and a second exit area where light reaches an upper surface after being reflected by upper and lower surfaces of the encapsulation layer is Area2, and Area3 may be divided in the same way. Next, a transmittance of Area1 is set to 40.0%, a transmittance of Area2 to 66.7%, and a transmittance of Area3 to 100%. Area3 is considered as a superposition part of optical paths of two LED light sources. In this way, according to LED luminous characteristics, a regional transmittance distribution design may ensure overall luminous uniformity under a condition of increasing a distance between two lamps.

In an exemplary embodiment, since a metal wiring layer is mainly of a metal wiring structure, a duty ratio (or aperture ratio) of the metal wiring layer may be controlled by any one or more of a wiring thickness and a wiring line width. In this way, by controlling the duty ratio (or aperture ratio) of the metal wiring layer, a regional transmittance control of light energy on a surface of each area in a transflective control area and energy regulation may be achieved, thus a light-uniformizing exiting effect on a light-exit surface is obtained.

Figure 8:
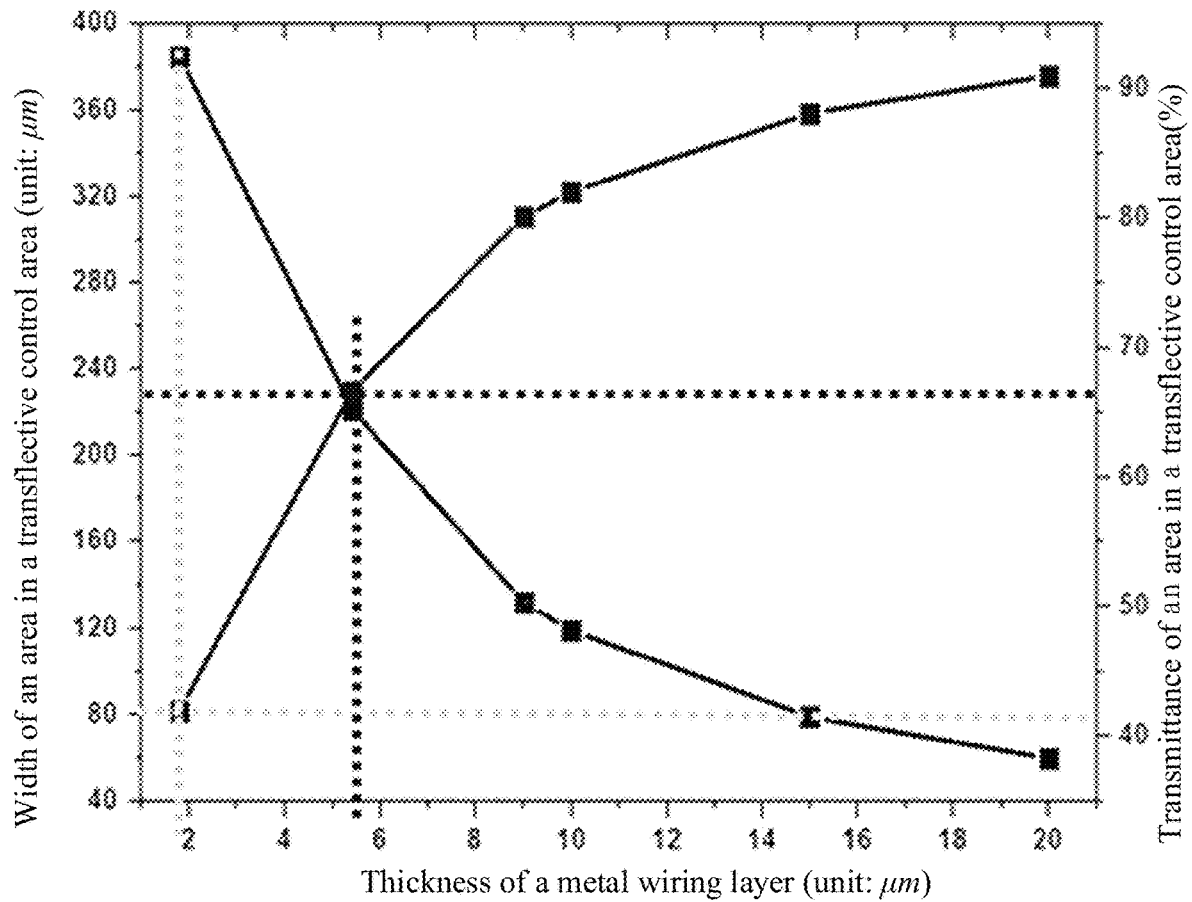
FIG. 8 is a schematic diagram of a relationship between a thickness of a metal wiring layer and a duty ratio according to an embodiment of the present disclosure.

For example, taking an example where a metal wiring layer is made of Cu (copper), a transmittance of Area1 is set to 40.0%, a transmittance of Area2 is set to 66.7%, and a transmittance of Area3 is set to 100%, and a duty ratio of the metal wiring layer is controlled by a wiring thickness, then according to a relationship between the thickness of the metal wiring layer and the duty ratio as shown in FIG. 8, a thickness of the wiring layer in Area1 may be set to 1.9 μm, a thickness of the wiring layer in Area2 may be set to 4.8 μm, and a thickness of the wiring layer in Area3 may be set to be without wiring.

Figure 9A:
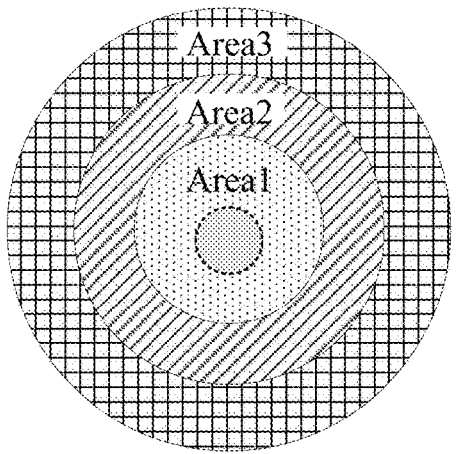
FIG. 9A is a schematic diagram of a transflective control area according to an embodiment of the present disclosure.
Figure 9B:
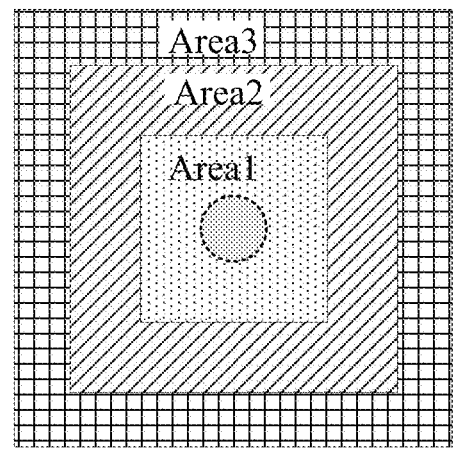
FIG. 9B is another schematic diagram of a transflective control area according to an embodiment of the present disclosure.

In an exemplary embodiment, multiple areas are any one of a circular ring area and a rectangular annular area. For example, taking a transflective control area including three areas as an example, as shown in FIG. 9A, the transflective control area may be concentrically disposed annular areas with different transmittances. As shown in FIG. 9B, the transflective control area may be a concentrically disposed rectangular annular area with different transmittances.

In an exemplary embodiment, there is an overlapping area between adjacent transflective control areas. For example, light-emitting elements are concentric square annular areas as shown in FIG. 9B, and according to a distribution design of a transflective control area as shown in FIG. 7, an outermost area (e.g., Area3) in the transflective control area belong to an overlapping part of two adjacent chips of light-emitting elements. In this way, due to use of an overlapping design of light-exit areas of light-emitting elements, light transmitted many times in an encapsulation layer or a substrate is superimposed to maintain a higher far-end brightness in a case of increasing a distance between adjacent chips of light-emitting elements, thereby ensuring light-exit uniformity of an entire light-emitting module. Therefore, according to the light-emitting module provided by the embodiment of the present disclosure, a quantity of chips of light-emitting elements required by the entire light-emitting module may be greatly reduced, and a cost is greatly optimized. For example, taking an example where light-emitting elements are divided into areas in a mode of concentric squares as shown in FIG. 9B according to a distribution design of a transflective control area as shown in FIG. 7, for a design of a light-emitting module for a 65-inch 4K display, a horizontal distance and a vertical distance of the Mini-LED array may all be designed to be 4.445 mm, and a size of an AA area in the 65-inch 4K display is 1430 mm*840 mm. Therefore, 61,000 Mini-LEDs may be used to achieve a light-emitting module with an OD of 0 mm, which is less than a demand of 100,000 Mini-LEDs for a conventional light-emitting module, and a cost is greatly optimized. Furthermore, according to an experiment of the present disclosure, a backlight uniformity of the light-emitting module with the OD of 0 mm achieved by 61,000 Mini-LEDs in the embodiment of the present disclosure is about 91.8%, which is far greater than a backlight uniformity of the conventional light-emitting module.

Hereinafter, taking a design solution of a transflective control area as shown in FIG. 7 as an example, how to determine a radius value or a side length value of each area in the transflective control area to determine coverage of the transflective control area will be described.

For a concentric ring area as shown in FIG. 9A, a radius value $R_n$ of each area in a transflective control area may satisfy the following Formula (4).

$$R_n = 0.5l + (2n - 1)t \times \tan\theta \qquad \text{Formula (4)}$$

In Formula (4), $R_n$ represents a radius value of the n-th level area, t represents a thickness of an encapsulation layer or a substrate, n represents a level of a divided area, θ represents a total reflection angle of light in the encapsulation layer or substrate, and l represents a side length of a chip of a light-emitting element.

At this time, a distance L between adjacent light-emitting elements may satisfy the following Formula (5).

$$L = l + 2 \times 2(N-1)t \times \tan\theta \qquad \text{Formula (5)}$$

In Formula (5), L represents a distance between adjacent light-emitting elements, l represents a side length of a chip of a light-emitting element, N represents a quantity of divided areas, t represents a thickness of an encapsulation layer or that of a substrate, θ represents a total reflection angle of light in the encapsulation layer or the substrate.

For a concentric square annular area as shown in FIG. 9B, a side length of each square in a transflective control area is the same as a diameter of each concentric circle in a transflective control area in a circular ring area as shown in FIG. 9A, which may satisfy the following Formula (6).

$$d_n = 2R_n \qquad \text{Formula (6)}$$

In Formula (6), $d_n$ represents a side length of the n-th level area, and $R_n$ represents a radius value of the n-th level area.

In order to achieve the highest utilization rate of light energy, 61% of energy in Area1 needs to be divided equally into each area. Therefore, a quantity N of divided areas of a transflective control area is related to a light efficiency of a final light-exit surface. If the quantity of divided areas increases, energy allocated to each area is relatively lower. A transmittance of each area in the transflective control area may be calculated through the following Formula (7).

$$T_n = \frac{2}{2 \times (N-n) + 1} \qquad \text{Formula (7)}$$

In Formula (7), n represents a level of a divided area; N represents a quantity of divided areas, and $T_n$ represents a transmittance of the n-th level area.

Furthermore, a transmittance of an outermost area in the transflective control area is 100%.

For example, taking an energy distribution in three areas as an example, if a transflective control area is a circular ring area as shown in FIG. 8A, according to the above Formula (4), radius values from Area1 to Area3 may be calculated as 0.919 mm, 1.788 mm, and 2.657 mm. If a transflective control area is a rectangular annular area as shown in FIG. 9B, according to the above Formula (6), side length values from Area1 to Area3 may be calculated as 1.838 mm, 3.576 mm, and 5.314 mm. According to the above Formula (5), a distance between adjacent light-emitting elements may be calculated as 4.445 mm. According to the above Formula (7), a transmittance of Area1 may be set to 40.0%, and a transmittance of Area2 may be set to 66.7%, and a transmittance of Area3 may be set to 100%.

Of course, in addition to energy distribution design solutions listed above, other calculation rules may be used to design an energy distribution of each area in a transflective control area, which also generates a light-uniformizing effect. For example, an entire surface energy may be set as 25% of a central energy for an energy distribution design.

In an exemplary embodiment, a metal wiring layer has a first surface close to a light-emitting element and a second surface away from the light-emitting element disposed oppositely, and at least one of the first surface and the second surface is provided with a reflective film. In this way, a reflective film with low absorption loss is correspondingly designed on at least one of the first surface and the second surface that are oppositely disposed on the metal wiring layer, so that absorption loss caused by the metal wiring layer in an optical path may be reduced, and a light efficiency of a light-emitting module may be improved.

Figure 10A:
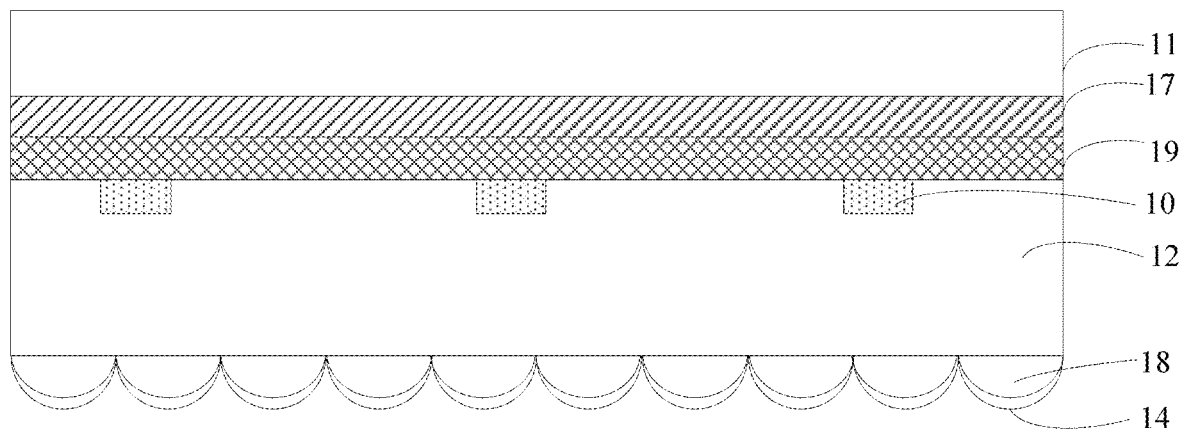
FIG. 10A is a schematic diagram of a fifth structure of a light-emitting module according to an embodiment of the present disclosure.
Figure 10B:
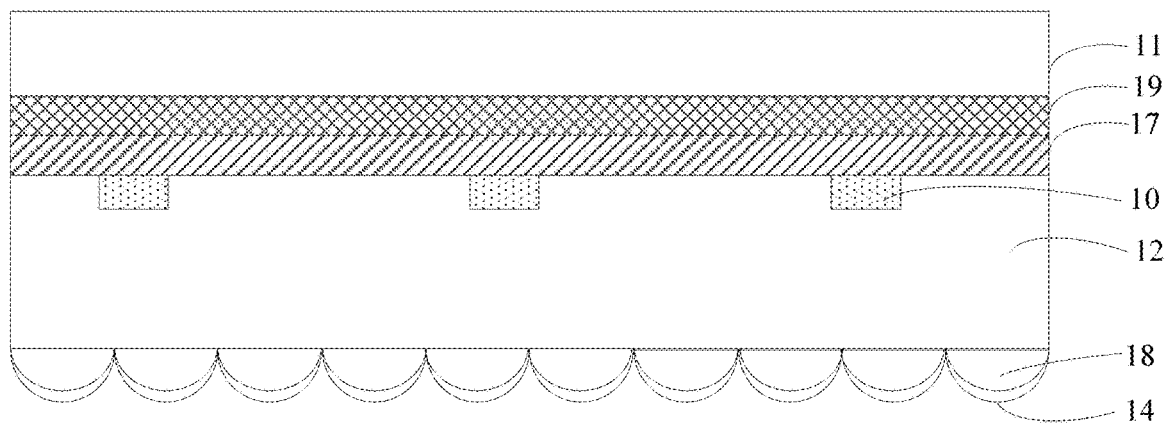
FIG. 10B is a schematic diagram of a sixth structure of a light-emitting module according to an embodiment of the present disclosure.
Figure 10C:
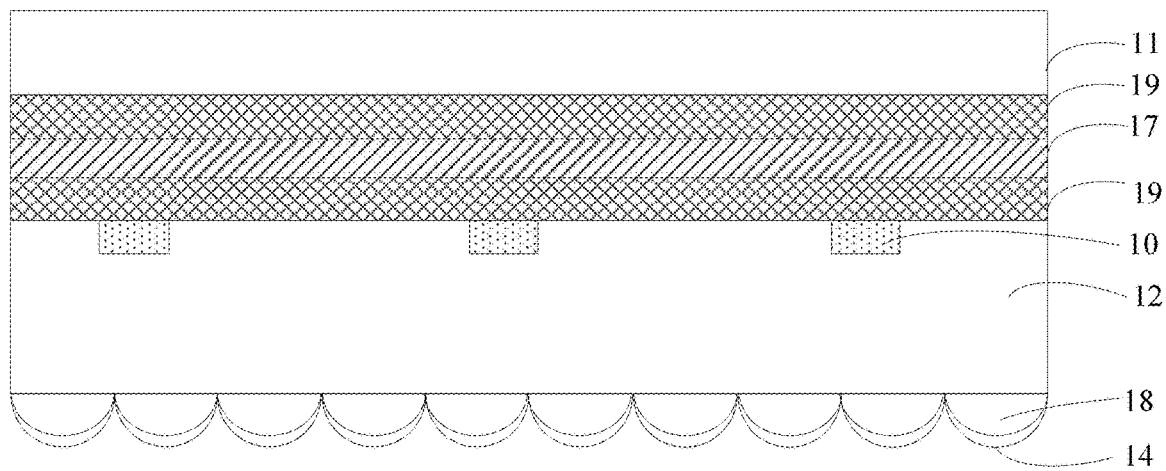
FIG. 10C is a schematic diagram of a seventh structure of a light-emitting module according to an embodiment of the present disclosure.

For example, taking a first light-uniformizing component being a microlens array, and microlenses in the microlens array being convex microlenses, and curved surfaces of the microlenses being convex in a direction away from light-emitting elements, as an example, as shown in FIGS. 10A, 10B, and 10C, the light-emitting module may further include a reflective film 19. As shown in FIG. 10A, the reflective film 19 may be disposed on the first surface of the metal wiring layer 17 close to the light-emitting element 10. Or, as shown in FIG. 10B, the reflective film 19 may be disposed on the second surface of the metal wiring layer 17 away from the light-emitting element 10. Or, as shown in FIG. 10C, the reflective film 19 may be disposed on the first surface of the metal wiring layer 17 close to the light-emitting element 10 and the second surface of the metal wiring layer 17 away from the light-emitting element 10. Here, the reflective film may cover only wirings in the metal wiring layer.

For example, reflective films provided on the first surface and the second surface of the metal wiring layer may be of an ITO/Ag/ITO composite structure, or may be high reflectivity material layers (such as white oil layers).

Here, the metal wiring layer is connected with a light-emitting element and may be used as a drive circuit layer of the light-emitting element to drive the light-emitting element to emit light.

In an exemplary embodiment, a material of the metal wiring layer may be Al (aluminum) material or Ag (silver) material and other materials that cannot absorb light. In this way, light reaching the metal wiring layer (for example, as a drive circuit layer of a light-emitting element) can be efficiently reflected or completely transmitted rather than being absorbed or lost, so that a light efficiency of a light-emitting module can be improved.

In addition, in order to prevent Ag oxidation, a thin ITO (indium tin oxide) layer needs to be deposited on a surface of an Ag layer for protection, so the metal wiring layer may be of an ITO/Ag/ITO or ITO/Ag/Al/Ag/ITO composite structure.

Each structure in a light-emitting module will be described in detail below.

In an exemplary embodiment, a material of a substrate may be a Printed Circuit Board (PCB) material, or may be a transparent material. For example, taking a material of a substrate as a transparent material as an example, considering requirements for an optical path and an ultra-thin device structure, a transmittance of the substrate may be as high as possible, so the material of the substrate may be a glass material. For example, the substrate may be a glass substrate with a refractive index of 1.52. For example, a thickness of the glass substrate may be 0.5 mm, 0.7 mm, etc. Of course, it may be others, and the embodiments of the present disclosure are not limited here.

In an exemplary embodiment, a refractive index of an encapsulation layer is less than or equal to a refractive index of a substrate. Therefore, it is ensured that light may exit from the substrate or the encapsulation layer. For example, the substrate may be a glass substrate with a refractive index of 1.52, and the encapsulation layer may be made of a PCB material with a refractive index of 1.5.

For example, a thickness of an encapsulation layer may be 0.2 mm, 0.5 mm, etc. Of course, it may be others, and the embodiments of the present disclosure are not limited here.

In an exemplary embodiment, the first light-uniformizing component may include any one of a microlens array and an uneven microstructure. Of course, it may be others, and the embodiments of the present disclosure are not limited here.

In an exemplary embodiment, the second light-uniformizing component may include any one of a microlens array and an uneven microstructure. Here, the embodiments of the present disclosure are not limited here.

Here, a microlens array is one of important micro-optical elements, which can achieve modulation functions of shaping, uniformizing, diffusing, and focusing an incident light by designing parameters such as a shape, a radius of curvature, an arrangement, and a thickness of a microlens.

In this embodiment of the present disclosure, a first light-uniformizing component is achieved by a microlens array using a light-uniformizing effect of the microlens array on light. The microlens array is superimposed under a substrate (i.e., a side away from a light-emitting element) when the substrate is located on a light-exit side of the light-emitting element, or under an encapsulation layer (i.e., a side away from the light-emitting element) when the encapsulation layer is located on the light-exit side of the light-emitting element, and a reflective layer (for example, a total reflection film) is added to a curved surface of the microlens array, which can solve a problem of a deficiency in light uniformity due to an energy distribution of a Lambertian light type LED light source. In addition, in a practical application, the microlens array may be disposed below the substrate or the encapsulation layer by using a process with a low influence on performance, such as dispensing, or by bonding, without a further processing on the substrate or the encapsulation layer, which will not affect stability of devices in the light-emitting module. Moreover, the micro-lens array has stronger processing controllability and a relatively higher design degree, which can ensure stability of performance of the light-emitting module and high product yield.

In an exemplary embodiment, a microlens array includes multiple convex or concave microlenses disposed in an array, wherein a curved surface of a microlens is a part of a spherical surface. For example, the curved surface of the microlens is hemispherical.

Figure 11A:
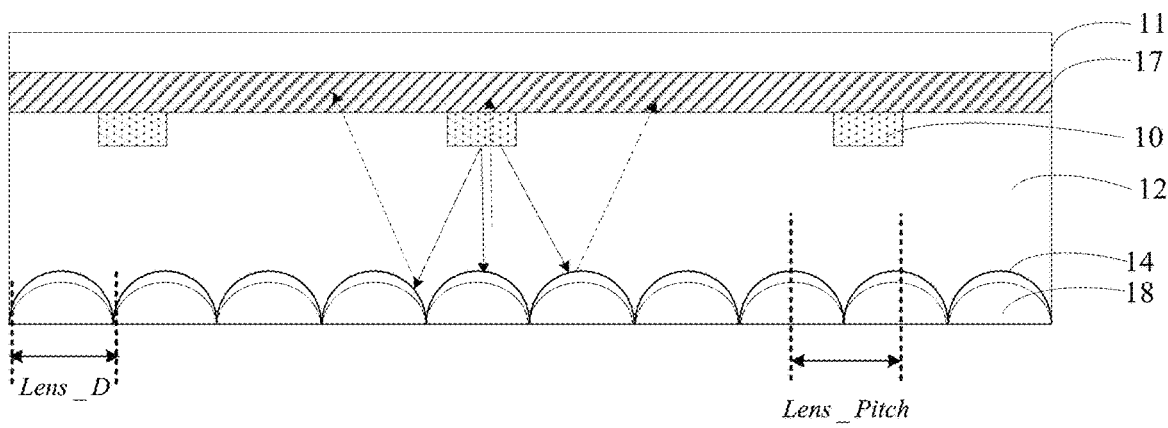
FIG. 11A is a schematic diagram of an eighth structure of a light-emitting module according to an embodiment of the present disclosure.
Figure 11B:
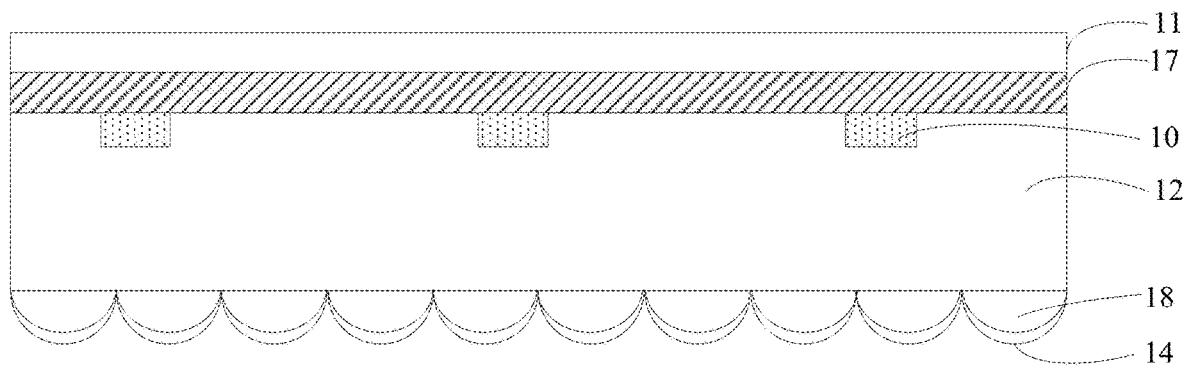
FIG. 11B is a schematic diagram of a ninth structure of a light-emitting module according to an embodiment of the present disclosure.

In an exemplary embodiment, taking a microlens array including multiple convex microlenses disposed in an array as an example, as shown in FIG. 11A, a surface of a microlens in a microlens array 18 close to a light-emitting element 10 may be a curved surface convex toward a direction close to the light-emitting element 10. In another exemplary embodiment, as shown in FIG. 11B, a surface of a microlens in a microlens array 18 away from a light-emitting element may be a curved surface convex toward a direction away from the light-emitting element 10.

Figure 11C:
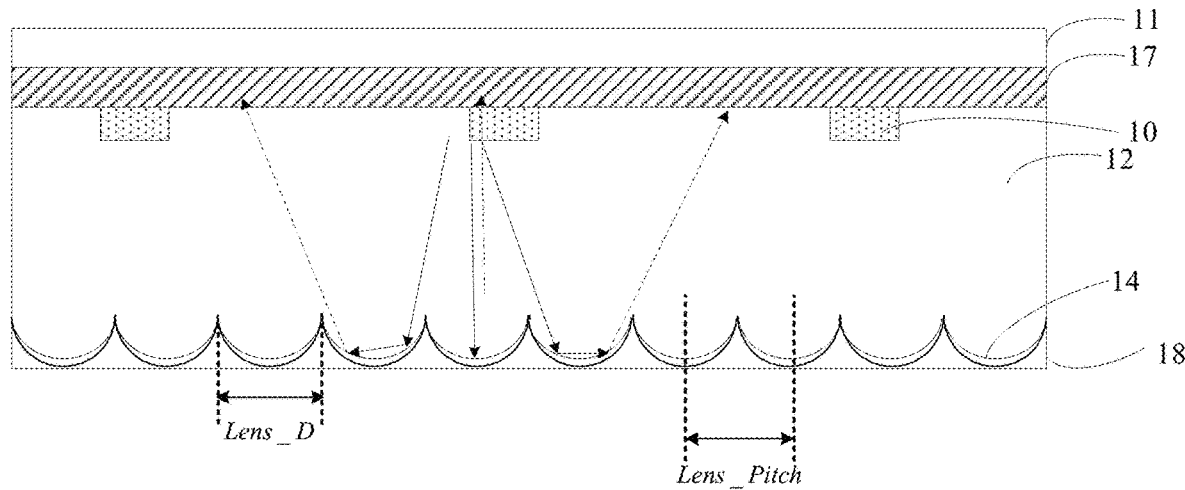
FIG. 11C is a schematic diagram of a tenth structure of a light-emitting module according to an embodiment of the present disclosure.
Figure 11D:
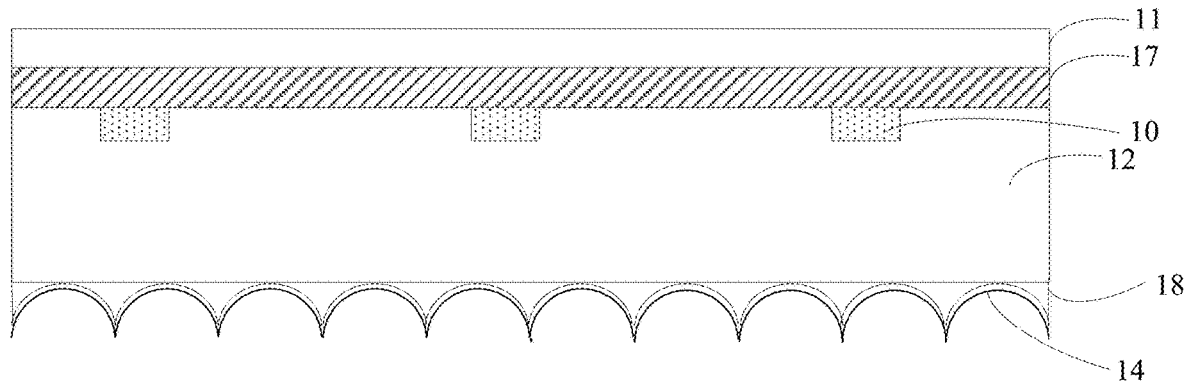
FIG. 11D is a schematic diagram of an eleventh structure of a light-emitting module according to an embodiment of the present disclosure.

In an exemplary embodiment, taking a microlens array including multiple concave microlenses disposed in an array as an example, as shown in FIG. 11C, a surface of a microlens in a microlens array 18 close to a light-emitting element 10 may be a curved surface concave toward a direction away from the light-emitting element 10. In another exemplary embodiment, as shown in FIG. 11D, a surface of a microlens in a microlens array 18 away from a light-emitting element may be a curved surface concave toward a direction close to the light-emitting element 10.

In an exemplary embodiment, a curved surface of a microlens array may face a light-exit surface of a light-emitting module (that is, a solution with a curved surface of a microlens array facing upwards). Or, a curved surface of a microlens array may face a non-light-exit surface of a light-emitting module (that is, a solution with a curved surface of a microlens array facing downwards). For example, as shown in FIG. 11A, taking a curved surface of a microlens array 18 as a convex curved surface as an example, when an encapsulation layer 12 is located on a light-exit side of a light-emitting element 10, the curved surface of the microlens array 18 may be attached below the encapsulation layer 12 (that is, a side of the encapsulation layer 12 away from the light-emitting element 10), and at this time, the curved surface of the microlens array 18 faces a light-exit surface of a light-emitting module (that is, the curved surface of the microlens array 18 faces upwards). For example, as shown in FIG. 11C, taking a curved surface of a microlens array 18 as a concave curved surface as an example, when an encapsulation layer 12 is located on a light-exit side of a light-emitting element 10, the curved surface of the microlens array 18 may be attached below the encapsulation layer 12 (that is, a side of the encapsulation layer 12 away from the light-emitting element 10), and at this time, the curved surface of the microlens array 18 faces a non-light-exit surface of a light-emitting module (that is, the curved surface of the microlens array 18 faces downwards).

In an exemplary embodiment, structural parameters of a microlens array may include any one or more of the following parameters: a diameter Lens_D of a single microlens may be less than 20 μm (for example, a diameter of a single microlens may be 2 μm, 4 μm, 6 μm, 8 μm, 9 μm, and 16 μm), where a diameter of a microlens may be a diameter of a spherical surface where a curved surface of the microlens is located; a ratio of the diameter Lens_D of the single microlens to a pitch Lens_Pitch between adjacent microlenses in either a row direction or a column direction of the microlens array (recorded as a duty ratio of the microlens array) may be greater than or equal to 2 (for example, Lens_D:Lens_Pitch=2:1). Here, when curved surfaces of microlenses are convex, a pitch between adjacent microlenses may be a pitch between vertices of convex surfaces of two adjacent microlenses, and when curved surfaces of microlenses are concave, a pitch between adjacent microlenses may be a pitch between lowest points of concave surfaces of two adjacent microlenses. In this way, small-angle light incident on a surface of a microlens array (small-angle light with concentrated LED main energy) is reflected at a slightly larger angle to avoid absorption loss of an upper LED chip; large-angle light incident on the surface of the microlens array (for example, large-angle light with an angle larger than a total reflection angle of a substrate) is reflected under a condition smaller than the total reflection angle, a quantity of rays limited in the substrate is reduced, the maximum light energy can be obtained, an light-taking amount of a light-emitting module may be improved, and a higher light efficiency may be obtained.

Here, a pitch between adjacent microlenses (or may be referred to as an arrangement period of microlenses) can characterize a degree of close contact of adjacent microlenses.

Figure 12:
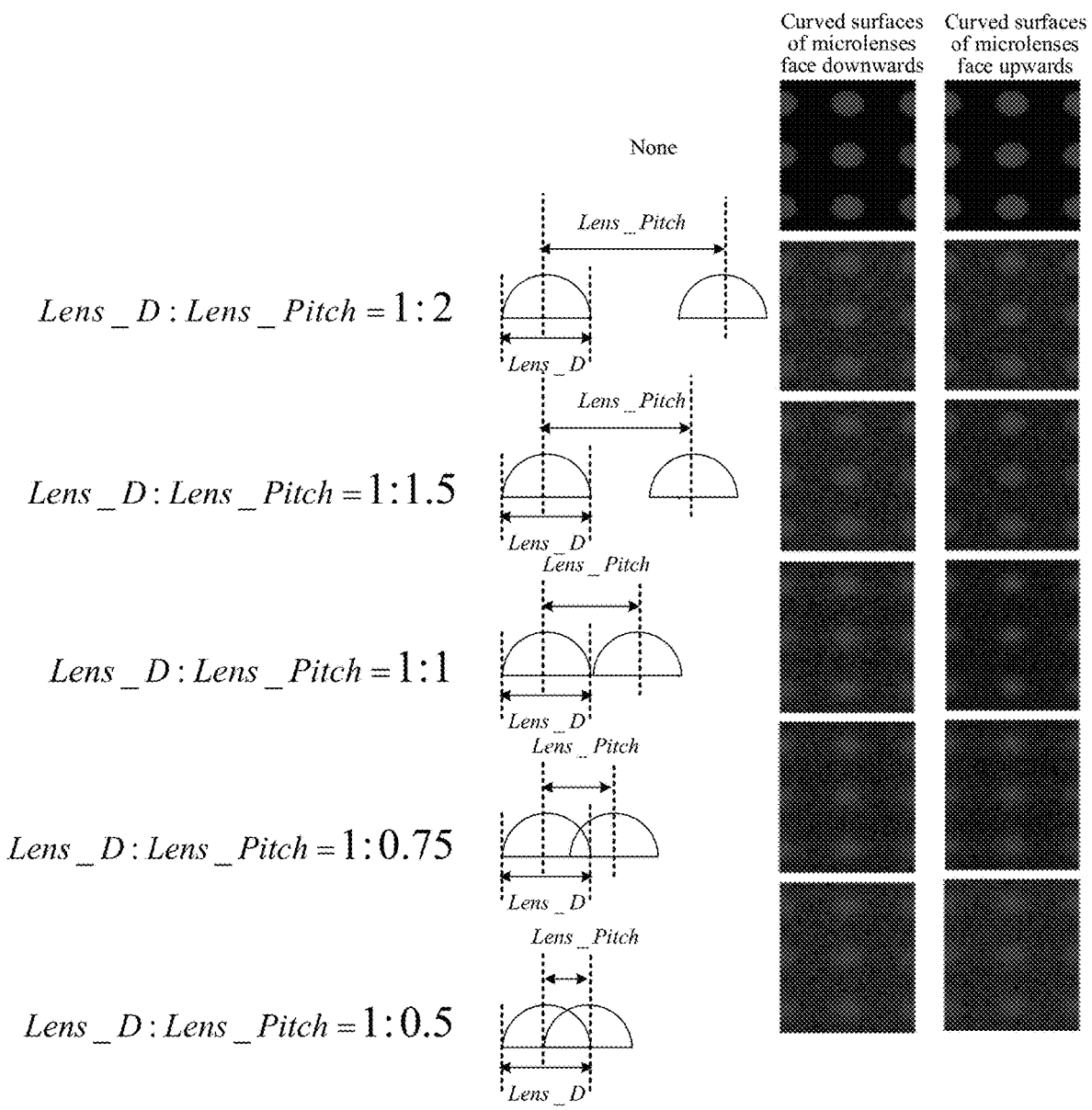
FIG. 12 is a diagram of light-uniformizing effects of a microlens array with different duty ratios according to an embodiment of the present disclosure.

In an exemplary embodiment, according to a difference in a ratio of a diameter Lens_D of a microlens to a pitch Lens_Pitch between adjacent microlenses, as shown in FIG. 12, adjacent microlenses have three difference states: spaced, overlapping, and in contact with each other. When the ratio of the diameter Lens_D of the microlens to the pitch Lens_Pitch between adjacent microlenses is less than 1, the adjacent microlenses are in a spaced state. When the ratio of the diameter Lens_D of the microlens to the pitch Lens_Pitch between adjacent microlenses is greater than 1, the adjacent microlenses are in an overlapping state. When the ratio of the diameter Lens_D of the microlens to the pitch Lens_Pitch between adjacent microlenses is equal to 1, the adjacent microlenses are in contact with each other.

For example, FIG. 12 is a diagram of light-uniformizing effects of a microlens array with different duty ratios. In FIG. 12, taking a diameter of microlens Lens_D=2 μm as an example, from top to bottom, a diagram of light-uniformizing effects is provided when the ratio of the diameter Lens_D of the microlens to the pitch Lens_Pitch between adjacent microlenses may be none (i.e., no microlens array), 1:2 (at this time, the Lens_Pitch between adjacent microlenses is 4 μm), 1:1.5 (at this time, the Lens_Pitch between adjacent microlenses is 3 μm), 1:1 (at this time, the Lens_Pitch between adjacent microlenses is 2 μm), 1:0.75 (at this time, the Lens_Pitch between adjacent microlenses is 1.5 μm), and 1:0.5 (at this time, the Lens_Pitch between adjacent microlenses is 1 μm), and schematic diagrams of adjacent microlenses corresponding to different ratios are given. As shown in FIG. 12, when Lens_D:Lens_Pitch=1: 0.5 (i.e., Lens_D:Lens_Pitch=2:1) for both of solutions of curved surfaces of microlenses facing upwards and curved surfaces of microlenses facing downwards in the microlens array, a better light-uniformizing effect can be obtained. That is to say, when adjacent microlenses are closely tightly disposed in a way of Lens_D:Lens_Pitch=1:0.5, a better light-uniformizing effect can be obtained. For example, a diameter of a microlens Lens_D=2 μm, and multiple microlenses are disposed in a two-dimensional array with Lens_Pitch=1 μm as a period. Here, a curved surface of a microlens facing upwards means that a surface of the microlens close to a light-emitting element is curved, and a curved surface of a microlens facing downwards means that a surface of the microlens away from a light-emitting element is a curved.

In an exemplary embodiment, a microlens in a microlens array may be made of polymethyl methacrylate (PMMA) or Printed Circuit Board (PCB), and of course, it may be made of another material, such as a material with a refractive index similar to that of an encapsulation layer or a substrate, which is not limited in the embodiments of the present disclosure.

In an exemplary embodiment, a difference between a refractive index of a microlens and that of at least one of a substrate and an encapsulation layer may be 0 to 1 (i.e., the refractive index of the microlens is similar to that of at least one of the substrate and the encapsulation layer). For example, the microlens may be made of a PMMA material with a refractive index of 1.49, the substrate may be made of a glass material with a refractive index of 1.52, and the encapsulation layer may be made of an encapsulation glue material with a refractive index of 1.5.

In an exemplary embodiment, a reflective layer may be disposed on a curved surface of a microlens array.

Figure 13A:
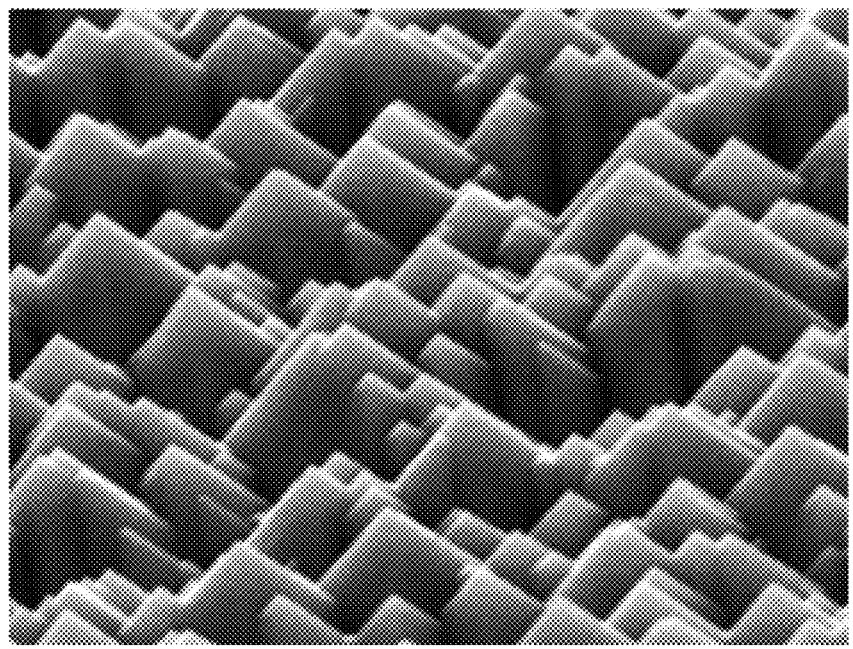
FIG. 13A is a schematic diagram of a structure of a microstructure according to an embodiment of the present disclosure.
Figure 13B:
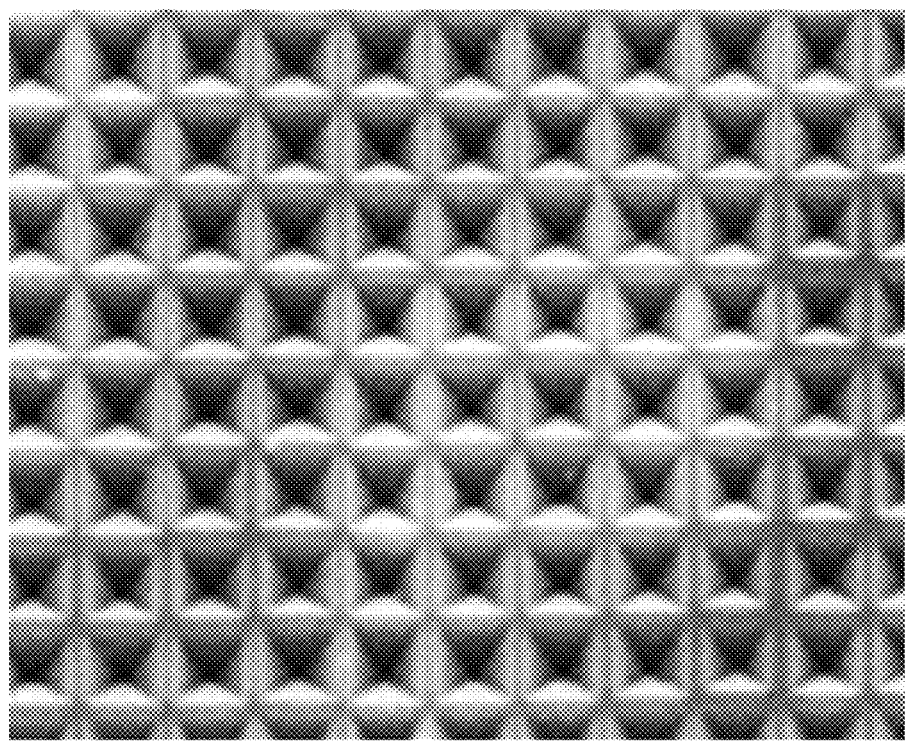
FIG. 13B is a schematic diagram of another structure of a microstructure according to an embodiment of the present disclosure.
Figure 13C:
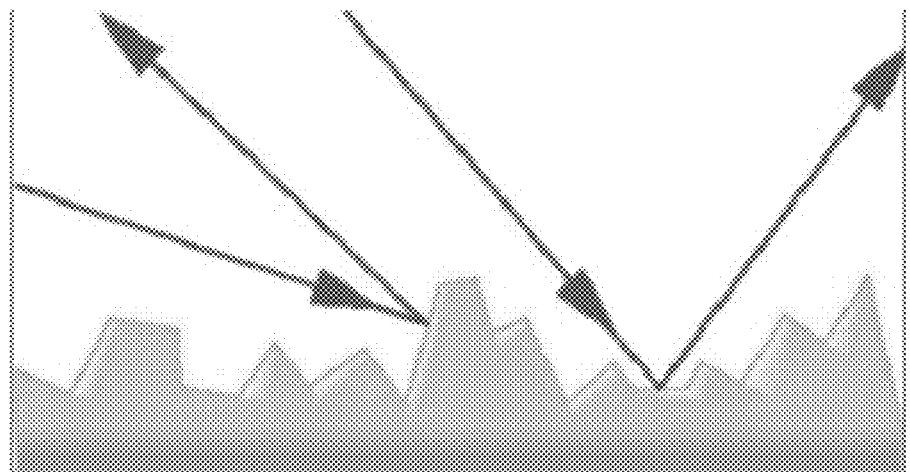
FIG. 13C is a schematic diagram of yet another structure of a microstructure according to an embodiment of the present disclosure.

In an exemplary embodiment, a microstructure may include multiple convex areas or multiple concave areas, wherein the multiple concave areas are areas other than the multiple convex areas in the microstructure, and the multiple convex areas and the multiple concave areas include any one or more of a part of a sphere and a part of a pyramid. A shape of a convex or concave structure is any one or more of prism frustum, truncated frustum, ellipsoid, hemisphere, pyramid-shape, pyramid, cone, and V-shape. For example, taking multiple convex areas and multiple concave areas including a part of a pyramid as an example, as shown in FIG. 13A, a microstructure may include: pyramid protrusions or depressions; or, as shown in FIG. 13B, a microstructure may be multiple pyramid structures disposed in an array (for example, for a microstructure including pyramid structures, nano-imprinting may be used for preparation); or, as shown in FIG. 13C, a microstructure may be a combination of multiple protrusions or depressions in a prism frustum and a pyramid.

In an exemplary example, taking an example where a microstructure is multiple pyramid structures disposed in an array, a side length of each pyramid structure may be 50 μm, and a distance between adjacent pyramid structures may be 50 μm. Here, a distance between adjacent pyramid structures may refer to a distance between center points of two adjacent pyramid structures.

In an exemplary embodiment, a microstructure may be achieved by wet etching, electrochemical texturing, reactive ion etching texturing, laser texturing, mask texturing, mechanical texturing, etc. Here, the embodiments of the present disclosure are not limited here.

In an exemplary embodiment, a reflective layer may be of a single-layer structure or a multi-layer structure, for example, a reflective layer may be of a single-layer structure of a material with high reflectivity, such as Ag (silver) film, white reflective material film, and white oil. For example, a reflective film may be of a multi-layer structure of materials with high reflectivity such as ITO/Ag/ITO. In this way, light incident on a reflective layer and scattered by a first light-uniformizing component may be reflected and emitted through an encapsulation layer or a substrate to obtain a light-exiting effect with high-uniformity.

In an exemplary embodiment, a thin film deposition technique may be used to deposit a reflective layer on a side of a first light-uniformizing component away from a light-emitting element.

In an exemplary embodiment, light-emitting elements may include multiple Mini-LED light sources.

Figure 14A:
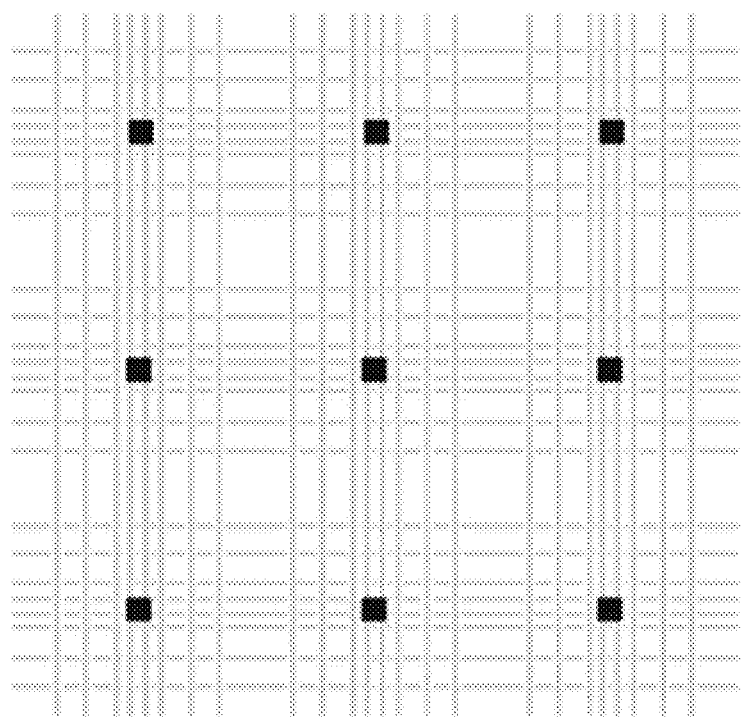
FIG. 14A is a schematic diagram of a distribution of Mini-LED light sources according to an embodiment of the present disclosure.

In an exemplary embodiment, taking light-emitting elements including multiple Mini-LED light sources as an example, as shown in FIG. 14A, the multiple Mini-LED light sources may be disposed in a quadrilateral distribution manner. In FIG. 14A, a Mini-LED light source is illustrated by a small black square. In this way, a light-exit surface may be utilized as high as possible, and a difficulty of wiring of a chip drive circuit can be reduced.

Figure 14B:
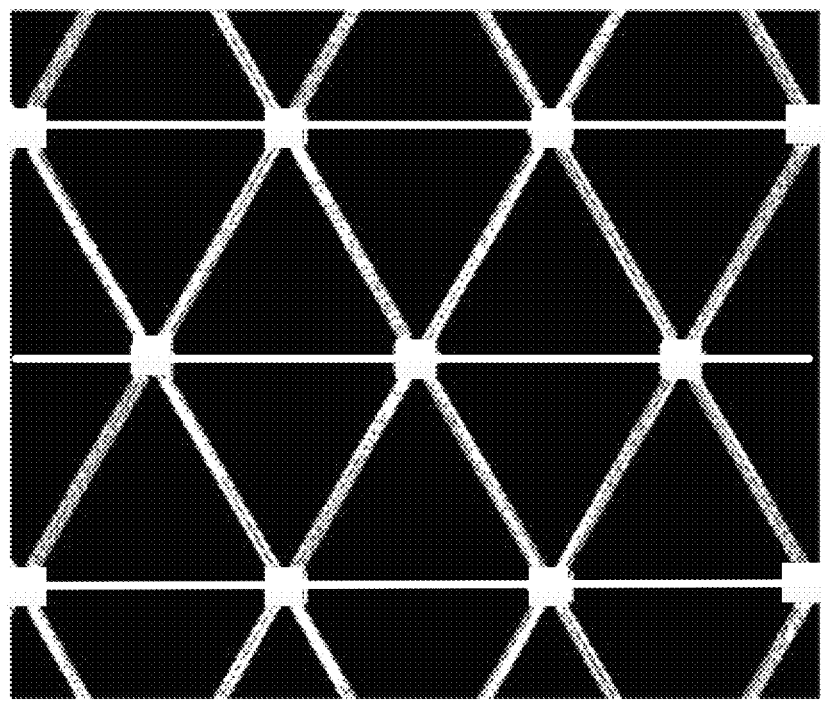
FIG. 14B is a schematic diagram of another distribution of Mini-LED light sources according to an embodiment of the present disclosure.

In another exemplary embodiment, taking light-emitting elements including multiple Mini-LED light sources as an example, as shown in FIG. 14B, the multiple Mini-LED light sources may be disposed in a regular triangle distribution manner. A Mini-LED light source is illustrated by a small white square in FIG. 14B. In this way, a light-exit area of each Mini-LED chip may be utilized most efficiently, so that a light-emitting module can achieve a backlight effect with a low thickness and high uniformity.

Of course, an arrangement of the light-emitting elements in the light-emitting module in the embodiment of the present disclosure may be other than the two arrangements listed above. Here, the embodiments of the present disclosure are not limited here.

In a practical application, a distance of Mini-LED light sources may be determined according to a design of divided areas, that is, an overlapping design of light-exit control ranges. For example, if Mini-LED light sources are disposed in a regular quadrangle, a distance between every two Mini-LED chips is the same in transverse and longitudinal directions, which may all be 4.445 mm (millimeter). When Mini-LED light sources are disposed in a regular triangle, a distance in a transverse direction may be 4.445 mm, and a distance in a longitudinal direction may be 3.849 mm.

In an exemplary embodiment, a size of a Mini-LED light source is 100 μm*100 μm.

Figure 15:
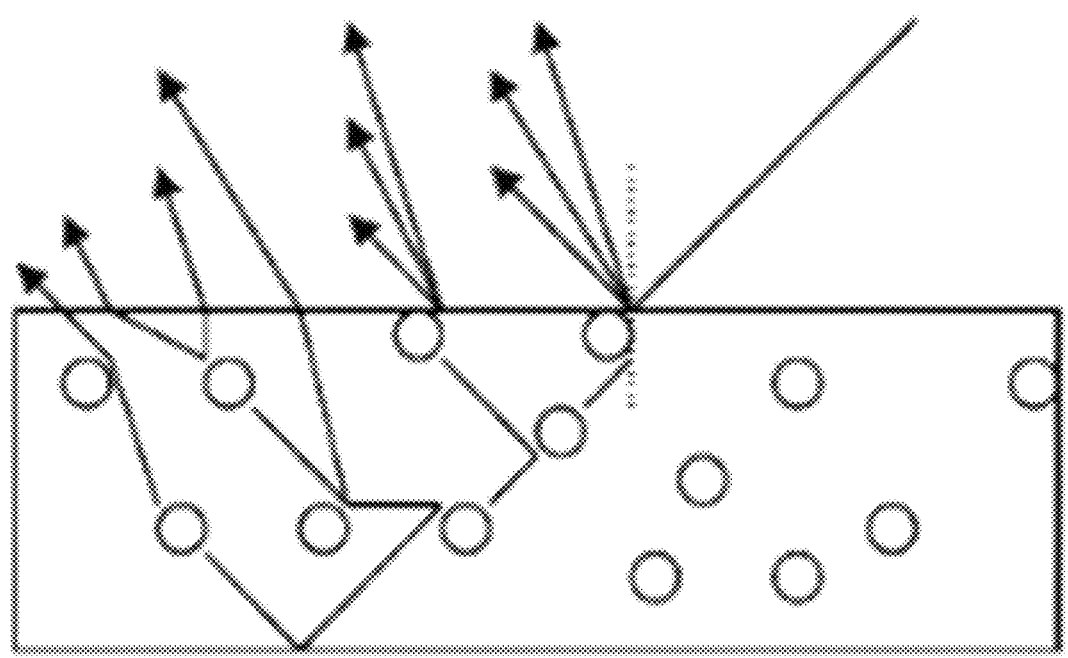
FIG. 15 is a schematic diagram of reflection when a foamed white reflective film is used to achieve a first light-uniformizing component and a reflective layer according to an embodiment of the present disclosure.

In an exemplary embodiment, a first light-uniformizing component and a reflective layer may be of an integrated structure, which is a diffuse reflective material layer with bubbles. For example, as shown in FIG. 15, a first light-uniformizing component and a reflective layer may be achieved by a foamed white reflective film. Here, the foamed white reflective film is formed by adding foaming agent (for example, titanium dioxide (TiO2)) or inert gas in a process of extruding a resin material (for example, polyethylene terephthalate (PET)) of a white reflective film to build small bubbles. In this way, the bubbles in the foamed white reflective film may achieve diffuse reflection.

In an exemplary embodiment, a transflective film may be achieved by a thin film made of Ni—Cr (nickel-chromium) alloy, or may be achieved by an Al (aluminum) thin film, or may be displayed by a multi-layer film alternately constructed by SiO2/TiO2 materials. Of course, it may be others, and the embodiments of the present disclosure are not limited here.

Based on the foregoing embodiments, the embodiment of the present disclosure provides a light-emitting module, taking the light-emitting element being a Mini-LED light source and a first light-uniformizing component being a microlens array as an example. In an exemplary embodiment, as shown in FIGS. 11A, 11B, 11C, and 11D, the light-emitting module may include multiple light-emitting elements 10 (Mini-LED light sources); a metal wiring layer 17 located on a non-light-exit side of the multiple light-emitting elements 10 (Mini-LED light sources); a substrate 11 located on a side of the metal wiring layer 17 away from multiple light-emitting elements 10 (Mini-LED light sources); an encapsulation layer 12 located on a light-exit side of the multiple light-emitting elements 10 (Mini-LED light sources); a microlens array 18 located on a side of the encapsulation layer 12 away from the multiple light-emitting elements 10 (Mini-LED light sources); and a reflective layer 14 located on a curved surface of the microlens array 18.

Next, the structure of the light-emitting module will be explained with a preparation process.

In the embodiments of the present disclosure, "film" and "layer" may be interchanged. For example, sometimes "reflective layer" may be replaced with "reflective film".

A "patterning process" mentioned in the embodiments of the present disclosure includes processes such as deposition of a film layer, coating of a photoresist, mask exposure, development, etching, and stripping of photoresist, and are mature manufacturing processes in the art. Deposition may be performed by using a known process such as sputtering, evaporation, chemical vapor deposition, and the like, coating may be performed by using a known coating process, and etching may be performed by using a known approach, which is not limited here. In description of the embodiments of the present disclosure, it should be understood that a "thin film" refers to a layer of thin film made of a material by using deposition or another process on a base substrate. If the "thin film" does not need a patterning process during a whole manufacturing process, the "thin film" may be called a "layer". If the "thin film" further needs a patterning process during the whole manufacturing process, it is called a "thin film" before the patterning process and a "layer" after the patterning process. The "layer" subsequent to the patterning process contains at least one "pattern".

For example, a glass substrate may be selected to be a substrate in a process, and a Mini-LED encapsulation layer may be used as a transmission structure of light emitted by a Mini-LED chip, which simplifies a whole process into a single-sided process, reduces a process difficulty in bonding, and increases a utilization rate of light energy. Copper may be selected as a material of a metal wiring layer. On one hand, an ITO/Ag/ITO reflective film corresponding to a structure of a copper wiring layer (i.e., a metal wiring layer) may be prepared on a lower surface of a glass substrate (i.e., a surface of a substrate close to a light-emitting element, that is, a surface of the metal wiring layer away from the light-emitting element) through a patterning process, so that the ITO/Ag/ITO reflective film covers a copper wiring, thus absorption loss of reflected light caused by the copper wiring layer (i.e., the metal wiring layer) in an optical path can be reduced. On the other hand, a white PR glue (Photoresist) layer corresponding to a structure of a copper wiring layer (i.e., a metal wiring layer) may be prepared on a lower surface (i.e., a surface of the metal wiring layer away from a light-emitting element) of the copper wiring layer through a patterning process, so that the copper wiring layer (i.e., the metal wiring layer) may construct a designed transflective control area with its aperture ratio. A white reflective material layer may be selected to be a reflective layer, and a microlens array board with the white reflective material layer is attached to a lower surface of an encapsulation layer (that is, a surface of the encapsulation layer away from the light-emitting element).

In addition, for preparation of a microlens array, a size of the microlens array involved in a light-emitting module provided by the embodiment of the present disclosure is relatively small (for example, a diameter of a microlens may be less than 20 μm, and a pitch between adjacent microlenses may be half of the diameter of the microlens), so an overall structure is simple and has strong uniformity. Based on this feature, a microlens array may be prepared using a spraying and dispensing technology. The microlens array with a cell size of less than 20 μm may be obtained by accurately positioning, dispensing, and then curing on an encapsulation layer. Corresponding to a process capability, a diameter of a microlens ranges from 4 μm to 16 μm, and improvement effects of uniformity are almost the same, all of which may achieve an improvement effect of about 10%.

Simulation software is used for modeling and simulation in the present disclosure. It may be seen from simulation results that in a backlight structure provided in the embodiments of the present disclosure, light-emitting elements are divided into concentric squares as shown in FIG. 9B. According to a distribution design of a transflective control area shown in FIG. 7, taking light-emitting modules shown in FIG. 11A, FIG. 11B, FIG. 11C, and FIG. 11D as examples, for a design of a light-emitting module of a 65-inch 4K display, a horizontal distance and a vertical distance of a Mini-LED array may all be designed to be 4.445 mm, and a size of an AA area in the 65-inch 4K display is 1430 mm*840 mm. Therefore, 61,000 Mini-LEDs may be used to achieve the light-emitting module with an OD of 0 mm, which is less than a demand of 100,000 Mini-LEDs in a conventional light-emitting module, and a cost is greatly optimized from one dimension. In addition, backlight uniformity of the light-emitting module with the OD of 0 mm achieved by using 61,000 Mini-LEDs in the embodiment of the present disclosure is about 91.8% or more, which is far greater than backlight uniformity of a conventional light-emitting module, and a light-uniformizing effect with high uniformity is achieved. In addition, in the light-emitting module in the embodiment of the present disclosure a diffusion sheet structure in an existing light-emitting module is omitted, and an overall thickness of the light-emitting module is reduced from 3.85 mm to 1.18 mm, thus reducing a cost of the light-emitting module from another dimension.

Based on the foregoing embodiments, an embodiment of the present disclosure provides a light-emitting module, in which a light-emitting element is a Mini-LED light source, a lower surface of a substrate is provided with a first light-uniformizing component and a reflective layer, and the encapsulation layer is provided with a second light-uniformizing component and a transflective film. The light-emitting module in the embodiment of the present disclosure will be described by taking both the first uniformizing component and the second uniformizing component being microstructures as an example. Then, in an exemplary embodiment, the light-emitting module may include multiple Mini-LED light sources; a metal wiring layer located on a light-exit side of the multiple Mini-LED light sources; a substrate located on a side of the metal wiring layer away from the multiple Mini-LED light sources; a first microstructure located on a side of the substrate away from the multiple Mini-LED light sources, a reflective layer located on a side of the first microstructure away from the multiple Mini-LED light sources, an encapsulation layer located on a non-light-exit side of the multiple Mini-LED light sources; a second microstructure located on a side of the encapsulation layer away from the multiple Mini-LED light sources; and a transflective film located on a side of the second microstructure away from the multiple Mini-LED light sources.

In this way, Mini-LED chips are inversely mounted on the substrate and disposed at a certain distance. A Mini-LED array emits light downwards in a form of a Lambertian light source; then, the substrate is used as a transmission layer to transmit the light emitted downwards by the Mini-LED array to increase an optical path and reduce a thickness of the light-emitting module. In addition, the light is scattered and reflected upwards by the first microstructure and the reflective layer disposed on the lower surface of the substrate (a side away from the light-emitting element), so that the reflected light may be effectively transmitted by the substrate, and the optical path is increased again. The thickness of the light-emitting module and a cost can be reduced, an overall light-exit efficiency can be improved as well as uniformity of light emitted from a light-exit surface, utilization of light energy of the light-emitting element can be increased, and a backlight light efficiency can be improved. Then, the encapsulation layer is used as a transmission layer to continuously transmit the reflected light, which increases the optical path again and reduces the thickness of the light-emitting module. Moreover, through the second microstructure and the transflective film disposed on the upper surface of the encapsulation layer, the emitted light is further scattered, a reflection angle and a diffraction angle are increased, most of the emitted light is made oscillate and transmit repeatedly in the encapsulation layer, thereby reducing a quantity of Mini-LEDs used, achieving uniform light exiting in a larger area while reducing power consumption. Therefore, a light-exiting effect with high uniformity on a surface of the light-emitting module can be achieved, a light-taking efficiency of the light-emitting module can be improved, the thickness and the cost of the light-emitting module can be reduced, and an overall light-exit efficiency of the light-emitting module can be increased.

For example, taking a first microstructure as that shown in FIG. 13C, light emitted by a Mini-LED reaching a lower surface of a substrate may be further scattered, so that small-angle light (e.g., 0 to 10 degrees) which concentrates most of energy may be scattered into reflected light of other angles, thus preventing the small-angle light from being reflected at a small angle again and affecting a uniform distribution effect of the energy. In addition, light with a large angle larger than a total reflection angle (for example, 41 degrees) of the substrate can be scattered and converted into light with a small angle within a range of the total reflection angle, so that light-taking of the substrate can be maximized and a backlight light efficiency can be improved.

Simulation software is used for modeling and simulation in the present disclosure. It may be seen from simulation results that according to the light-emitting module provided by the embodiment of the present disclosure, a light-exit uniformity greater than 80% (where local uniformity is greater than 81%, and overall uniformity is greater than 93%) can be obtained at a zero optical distance on a surface of the light-emitting module. In addition, a light efficiency of the light-emitting module can reach 78%. In this way, a light-uniformizing effect with a high light-uniformizing degree can be achieved at the zero optical distance of zero of the light-emitting module.

An embodiment of the present disclosure further provides a display module, which includes a display panel and the light-emitting module in one or more of the above embodiments, wherein the display panel is disposed on a side away from a light-exit side of a light-emitting element.

In an exemplary embodiment, the display module may be any product or component with a display function such as a mobile phone, a tablet computer, a television, a display, a laptop computer, a digital photo frame, and a navigator.

Although the embodiments disclosed in the present disclosure are described as above, the contents described are merely embodiments used to facilitate understanding of the present disclosure and are not used to limit the present disclosure. Those skilled in the art may make any modifications and variations to implementation forms and details without departing from the spirit and scope disclosed by the present disclosure. However, the patent protection scope of the present disclosure should also be subject to the scope defined by the appended claims.

What is claimed is:

1. A light-emitting module, comprising a substrate, at least one light-emitting element located on a side of the substrate, and a first light-uniformizing component and a reflective layer disposed on a light-exit side of the light-emitting element; wherein,
    the first light-uniformizing component is configured to make light emitted by the light-emitting element be uniformly incident on the reflective layer; and
    the reflective layer is configured to reflect the light incident on the reflective layer toward a direction away from the light-exit side of the light-emitting element.

2. The light-emitting module according to claim 1, further comprising an encapsulation layer, wherein the encapsulation layer and the substrate are respectively located on two sides of the light-emitting element.

3. The light-emitting module according to claim 2, further comprising a second light-uniformizing component disposed on a side away from the light-exit side of the light-emitting element, configured to uniformize light emitted from the substrate when the substrate is located on a side away from the light-exit side of the light-emitting element, or configured to uniformize light emitted from the encapsulation layer when the encapsulation layer is located on a side away from the light-exit side of the light-emitting element.

4. The light-emitting module according to claim 3, further comprising a transflective film disposed on a side of the second light-uniformizing component away from the light-emitting element.

5. The light-emitting module according to claim 3, wherein the first light-uniformizing component comprises any one of a microlens array and an uneven microstructure, and/or the second light-uniformizing component comprises any one of a microlens array and an uneven microstructure.

6. The light-emitting module according to claim 5, wherein the microlens array comprises a plurality of convex or concave microlenses disposed in an array, wherein a curved surface of the microlens is a part of a spherical surface.

7. The light-emitting module according to claim 6, wherein a structural parameter of the microlens array comprises any one or more of the following parameters:
a diameter of a single microlens being less than 20 μm; and
a ratio of the diameter of the single microlens to a pitch between adjacent microlenses in either a row direction or a column direction of the microlens array being greater than or equal to 2.

8. The light-emitting module according to claim 6, wherein a difference between a refractive index of the microlens and a refractive index of at least one of the substrate and the encapsulation layer is 0 to 1.

9. The light-emitting module according to claim 5, wherein the microstructure comprises a plurality of convex areas and a plurality of concave areas, wherein the plurality of concave areas are areas other than the plurality of convex areas in the microstructure, and the plurality of convex areas and the plurality of concave areas comprise any one or more of a part of a sphere and a part of a pyramid.

10. The light-emitting module according to claim 1, further comprising a metal wiring layer disposed between the substrate and the light-emitting element, wherein,
the metal wiring layer comprises a plurality of transflective control areas, and each transflective control area comprises a plurality of areas with different transmittances disposed concentrically.

11. The light-emitting module according to claim 10, wherein the plurality of areas are any one of a circular ring area and a rectangular annular area.

12. The light-emitting module according to claim 10, wherein there is an overlapping area between adjacent transflective control areas.

13. The light-emitting module according to claim 10, wherein the metal wiring layer has a first surface close to the light-emitting element and a second surface away from the light-emitting element, and the first surface and the second surface are disposed oppositely, and at least one of the first surface and the second surface is provided with a reflective film.

14. The light-emitting module according to claim 2, wherein a refractive index of the encapsulation layer is less than or equal to a refractive index of the substrate.

15. The light-emitting module according to claim 1, wherein the light-emitting element comprises a Mini-LED.

16. The light-emitting module according to claim 15, wherein a plurality of Mini-LEDs are disposed in a quadrilateral or regular triangle distribution.

17. The light-emitting module according to claim 1, wherein the first light-uniformizing component and the reflective layer are of an integrated structure, which is a diffuse reflective material layer with bubbles.

18. A display module, comprising a display panel and a light-emitting module, wherein
the light-emitting module comprises a substrate, at least one light-emitting element located on a side of the substrate, and a first light-uniformizing component and a reflective layer disposed on a light-exit side of the light-emitting element; wherein,
the first light-uniformizing component is configured to make light emitted by the light-emitting element be uniformly incident on the reflective layer; and
the reflective layer is configured to reflect the light incident on the reflective layer toward a direction away from the light-exit side of the light-emitting element; and
the display panel is disposed on a side away from the light-exit side of the light-emitting element.

19. The display module according to claim 18, wherein the light-emitting module further comprises an encapsulation layer, wherein the encapsulation layer and the substrate are respectively located on two sides of the light-emitting element.

20. The display module according to claim 18, wherein the light-emitting module further comprises a metal wiring layer disposed between the substrate and the light-emitting element, wherein,
the metal wiring layer comprises a plurality of transflective control areas, and each transflective control area comprises a plurality of areas with different transmittances disposed concentrically.

* * * * *